(12) United States Patent
Ounadjela et al.

(10) Patent No.: US 6,798,691 B1
(45) Date of Patent: Sep. 28, 2004

(54) ASYMMETRIC DOT SHAPE FOR INCREASING SELECT-UNSELECT MARGIN IN MRAM DEVICES

(75) Inventors: Kamel Ounadjela, Belmont, CA (US); Frederick B. Jenne, Los Gatos, CA (US)

(73) Assignee: Silicon Magnetic Systems, San Jose, CA (US)

( * ) Notice: Subject to any disclaimer, the term of this patent is extended or adjusted under 35 U.S.C. 154(b) by 0 days.

(21) Appl. No.: 10/184,232

(22) Filed: Jun. 28, 2002

Related U.S. Application Data
(60) Provisional application No. 60/362,286, filed on Mar. 7, 2002.

(51) Int. Cl.[7] .............................................. G11C 11/14
(52) U.S. Cl. ........................ 365/171; 365/173; 365/158
(58) Field of Search ........................... 365/158, 1, 171, 365/173, 39, 43, 55, 66

(56) References Cited

U.S. PATENT DOCUMENTS

| | | | | |
|---|---|---|---|---|
| 4,514,827 A | * | 4/1985 | Washburn ....................... | 365/1 |
| 4,625,297 A | * | 11/1986 | Yanase ......................... | 365/39 |
| 5,459,701 A | | 10/1995 | Tokita et al. | |
| 5,757,695 A | | 5/1998 | Shi et al. | |
| 6,005,800 A | * | 12/1999 | Koch et al. ................... | 365/173 |
| 6,104,633 A | * | 8/2000 | Abraham et al. ............ | 365/171 |
| 6,178,112 B1 | | 1/2001 | Bessho et al. | |

* cited by examiner

Primary Examiner—David Lam
(74) Attorney, Agent, or Firm—Kevin L. Daffer; Mollie E. Lettang; Conley Rose P.C.

(57) ABSTRACT

A magnetic memory cell and method for improving the write selectivity of memory cells in an MRAM array is provided herein. In particular, the magnetic memory cell may have a magnetic layer with a shape that is substantially asymmetrical about at least one axis of the magnetic layer. Such asymmetry may advantageously reduce and/or eliminate the effects of variations in the fabrication process. In addition, an asymmetrical memory shape may induce a relatively consistent equilibrium vector state, allowing a single switching mechanism to set the magnetic direction of the cell. Furthermore, a method is provided for programming a memory cell, in which the amount of current needed during a writing procedure is advantageously reduced relative to the amount of current needed in conventional writing procedures. In this manner, the asymmetrical memory cell and method produces a storage medium having overall power requirements less than those associated with symmetrical memory cells.

20 Claims, 12 Drawing Sheets

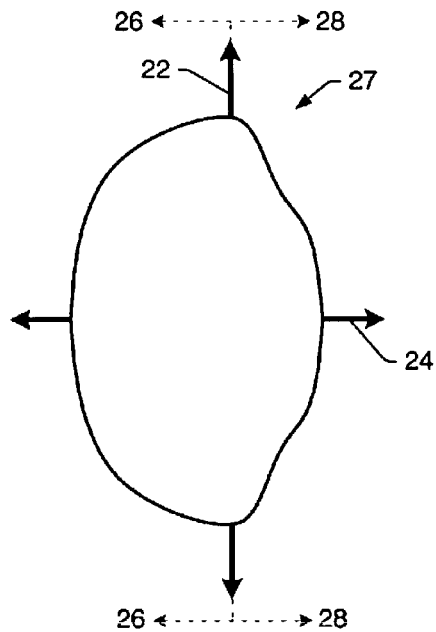
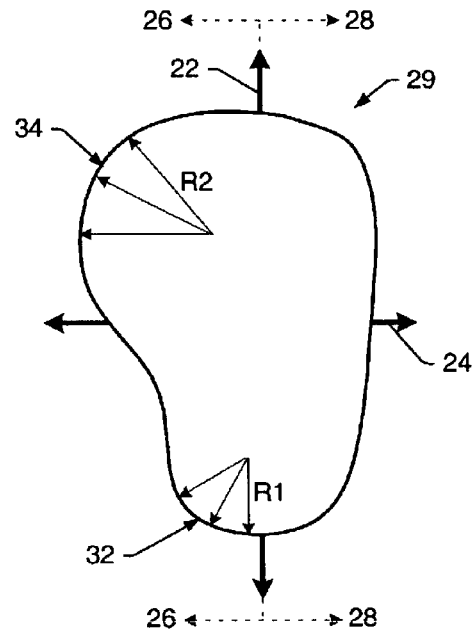
FIG. 2E          FIG. 2F
| | |
|---|---|
| Ellipse: | Operation window for writing: 0.8mA<br>Current variation for writing to the Select: [2mA – 4.2mA]<br>Current variation for writing to the Disturb: [5mA – 11.5mA] |
| Asymmetric shape: | Operation window for writing: 3mA<br>Current variation for writing to the Select: [1.3mA – 3mA]<br>Current variation for writing to the Disturb: [6mA – 8.8mA] |
FIG. 6

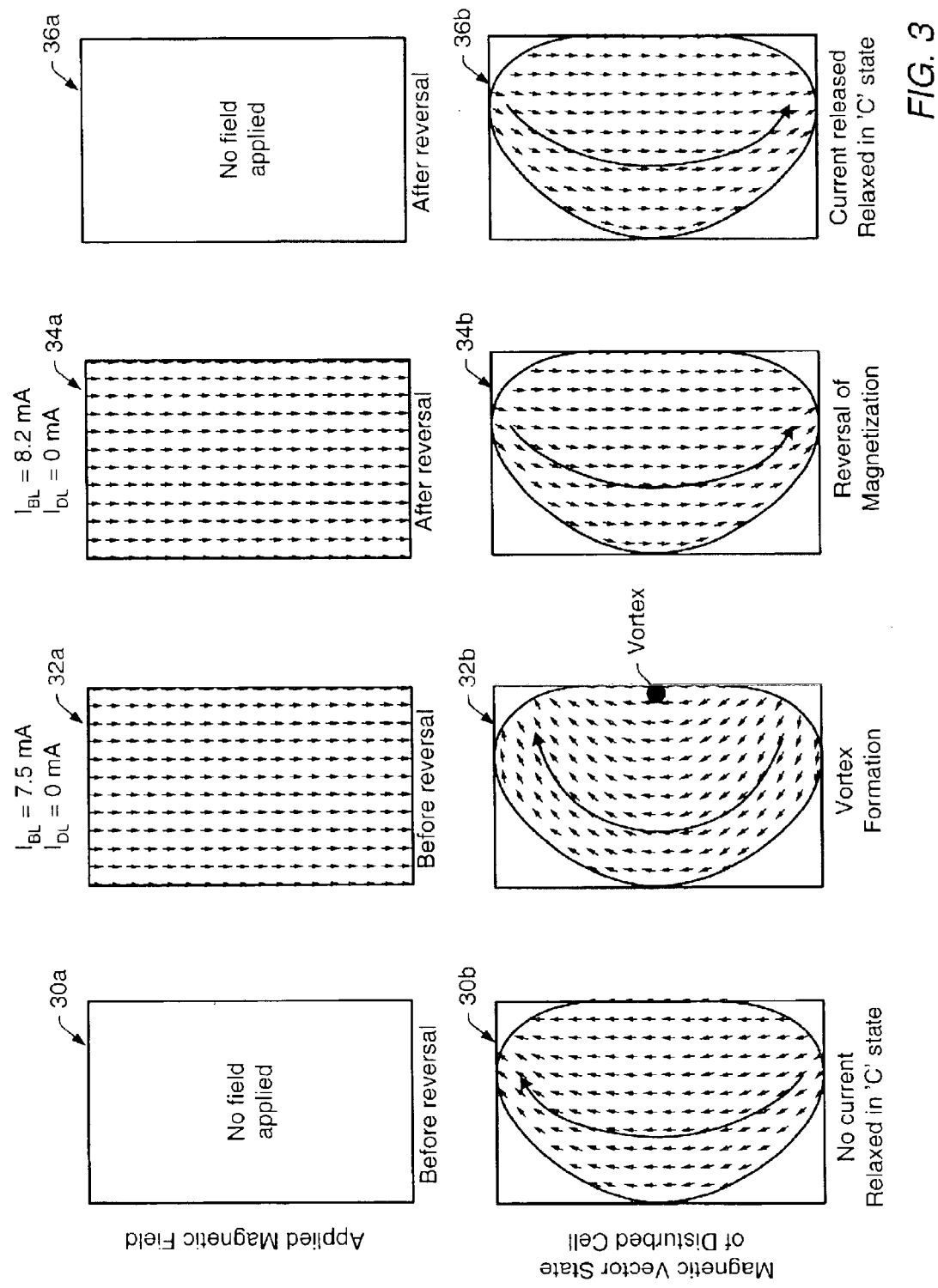
FIG. 3 (REVERSAL B)

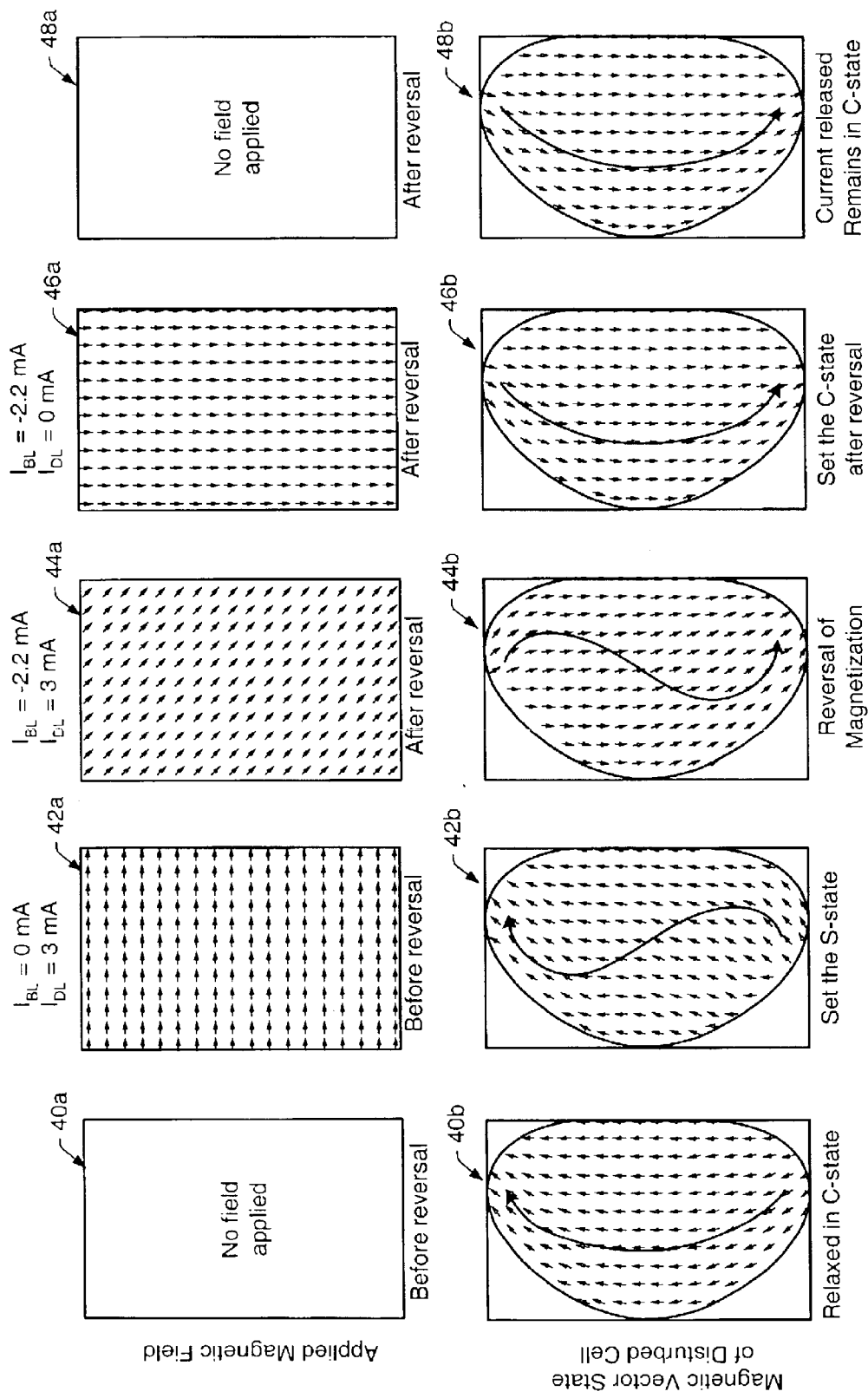
FIG. 4 (REVERSAL A)

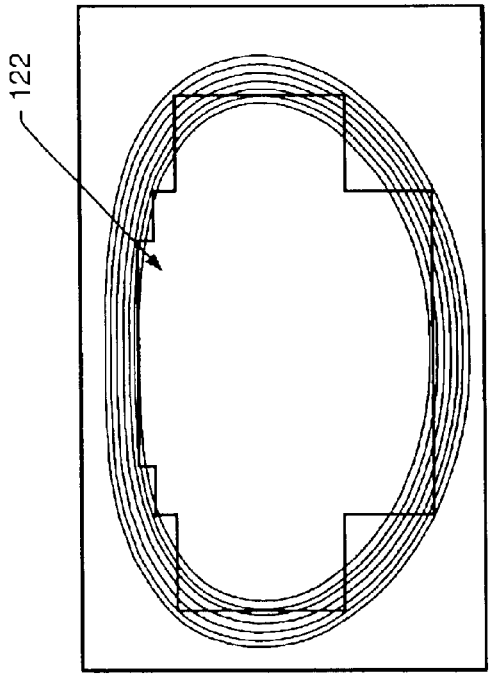
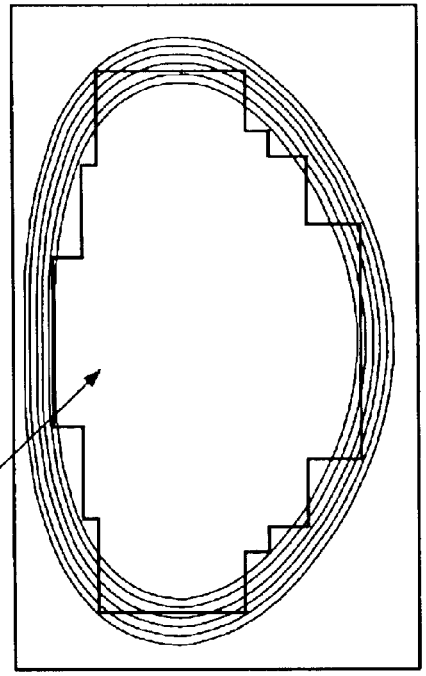
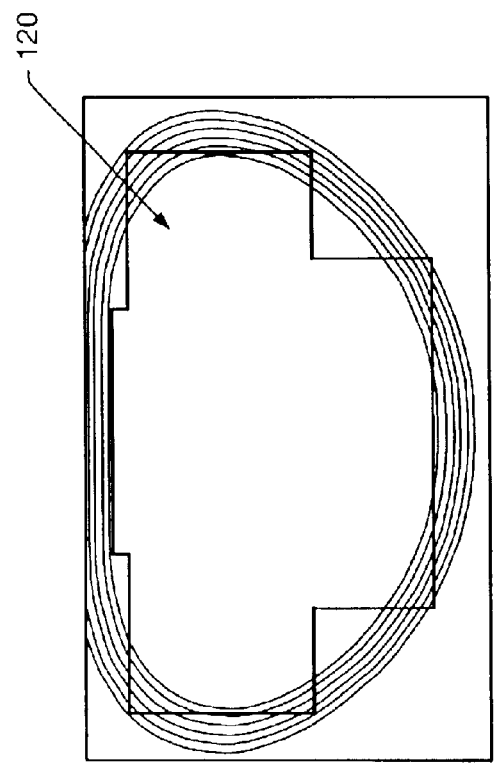
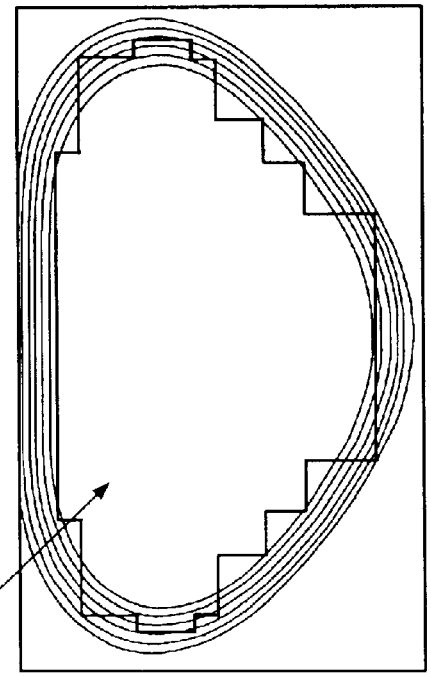

ASYMMETRIC DOT SHAPE FOR INCREASING SELECT-UNSELECT MARGIN IN MRAM DEVICES

PRIORITY APPLICATION

This application claims benefit of priority to the provisional patent application Ser. No. 60/362,286, filed Mar. 7, 2002.

BACKGROUND OF THE INVENTION

1. Field of the Invention

This invention relates to magnetic memory cells and, more particularly, to a system and method for improving the write selectivity of individual memory cells in a magnetic random access memory (MRAM) array.

2. Description of the Related Art

The following descriptions and examples are not admitted to be prior art by virtue of their inclusion within this section.

A non-volatile memory circuit maintains stored information even when electricity is removed from the circuit. Recently, advancements in the use of magneto-resistive materials have revolutionized the development of non-volatile memory circuits with the introduction of magnetic random access memory (MRAM). MRAM circuits advantageously exploit the electromagnetic properties of magneto-resistive materials to set and maintain information stored within individual memory cells of the circuit. In particular, MRAM circuits utilize magnetization direction to store information within a memory cell, and differential resistance measurements to read information from the memory cell. In other words, information is stored within an MRAM cell as a magnetic bit, the state of which is indicated by the orientation of magnetization within one layer of the memory cell relative to another layer of the memory cell. In addition, a differential resistance can be obtained from differences in the magnetization directions between layers of the memory cell. Such a differential resistance can be used to read the magnetic state of the bit stored in the MRAM cell.

An MRAM cell typically includes a plurality of layers with at least two magnetic layers separated by a nonmagnetic layer, and therefore, is sometimes referred to as a magnetic stack. A lower magnetic layer (e.g., a pinned magnetic layer) of the magnetic stack is usually fixed in a predefined magnetic direction to be used as a reference direction. To store information, however, the magnetic direction of an upper magnetic layer (e.g., a storage layer or a free magnetic layer), which is separated from the lower magnetic layer by a nonmagnetic layer, can be manipulated into a direction that is parallel or anti-parallel to the magnetic direction of the lower magnetic layer. Note that the term anti-parallel is used herein to describe a magnetic direction that is oriented 180° from the reference magnetic direction of the lower magnetic layer.

In general, a bit of information may be written to an MRAM cell by applying current that induces a magnetic field external to the cell. Such an external magnetic field may then force a majority of the internal magnetic field vectors within the free magnetic layer to align in a direction, either parallel or anti-parallel, relative to the magnetic direction of the pinned magnetic layer. Thus, the magnetic state of the stored bit is determined by the variable magnetic direction within the free magnetic layer. Once the bit is stored, however, the current may be discontinued without losing or altering the magnetic state of the stored bit.

In one example, a bit may be written to the free magnetic layer of an MRAM cell as a logic "0" (i.e., logic low) value when the magnetic direction of the free magnetic layer is substantially parallel to the magnetic direction of the pinned magnetic layer. In another example, a bit may be written to the free magnetic layer of an MRAM cell as a logic "1" (i.e., logic high) value when the magnetic direction of the free magnetic layer is substantially anti-parallel to the magnetic direction of the pinned magnetic layer. In either example, the stored bit may be read from the MRAM cell by measuring the resistance between the free and pinned magnetic layers, such that a logic 1 value is determined by a relatively higher resistance than a logic 0 value.

In addition, an MRAM cell typically includes an easy axis and a hard axis of magnetization, both of which are oriented along a single plane in directions perpendicular to one another. Note that the terms easy axis and hard axis of magnetization are used herein to describe the inherent tendency of the magnetization within the free magnetic layer to align along one axis versus another axis, at times when substantially no external magnetic field is present. In particular, the previously defined parallel or uni-parallel-anti-parallel directions of magnetization are typically oriented along the easy axis of magnetization. Such an orientation along the easy axis usually permits the stored information to be non-volatile. In other words, the magnetization within the free magnetic layer (inc., stored information) may be retained along either the parallel and anti-parallel orientation of the easy axis even when power to the memory cell is removed.

As will be discussed in more detail below, the easy axis of magnetization is usually an inherent result of the shape of the MRAM cell. Thus, the easy axis of magnetization is typically arranged along the length of the MRAM cell, and is sometimes referred to as the long, or longitudinal axis of magnetization. The magnetic state of the MRAM cell is usually defined by the magnetic direction along the easy axis of magnetization. The magnetic hard axis, however, is typically arranged along the width of the MRAM cell, and is sometimes referred to as the short, or transverse axis of magnetization. Since an external magnetic field may be needed to orient the magnetization within the free magnetic layer along the hard axis, the magnetic state of the MRAM cell is not typically stored along the hard axis.

An MRAM circuit typically includes a plurality of bit lines and digit lines, such that the plurality of bit lines is substantially perpendicular to the plurality of digit lines. An MRAM circuit also includes a plurality of MRAM cells, such as those described above, where each of the plurality of MRAM cells is approximately arranged at intersecting regions between individual bit lines and digit lines. In this manner, when current is simultaneously applied along a particular bit line and a particular digit line, the applied current may induce an external magnetic field large enough to switch the magnetization of an individual memory cell. Such an individual memory cell may herein be referred to as a selected memory cell, or the memory cell intentionally targeted for a writing procedure.

During the writing procedure, the multitude of memory cells arranged along the selected bit line and the selected digit line will sense an amount of current typically less than the amount of current sensed by the selected memory cell. Such memory cells are herein referred to as half selected cells, or disturbed cells. Even though less current is applied to these disturbed cells, fabrication process variations may allow a false bit to be unintentionally written to one or more of the disturbed cells. The writing of false bits, however, is undesirable and indicates failure of the memory device to store accurate information. Though all memory cells within an MRAM circuit are generally fabricated at the same time, variations in the fabrication process may produce variations in shape, size, and/or the presence of defects within individual memory cells. It may be these variations within individual memory cells that are typically responsible for the occurrence of false bits.

As such, a particular MRAM cell shape (e.g., an elliptically-shaped memory cell) may store inaccurate information due to its sensitivity to variations in shape, size, and defects. In fact, the variations may be so large that information can be accidentally stored to one or more unselected memory cells (i.e., cells not arranged along the selected bit line or digit line), which exhibit unusually lower switching fields than expected. Sensitivity to variations in shape and size may also disadvantageously reduce the current margin between selected and disturbed cells, thereby reducing the write selectivity between MRAM cells. In other words, the relative difference (i.e., current margin) between the amount of current responsible for switching the magnetization of a disturbed cell and the amount of current needed to switch the magnetization of a selected cell (i.e., the write selectivity) may be reduced as a result of the variations within individual memory cells.

Therefore, it would be advantageous to provide an MRAM cell having a configuration that is substantially insensitive to variations in shape, size, and the presence of defects. Such a memory cell configuration may advantageously increase the write selectivity between select and disturb cells over other cell configurations. In addition, it would be beneficial to provide a method, which not only reduces the current margin between individual memory cells, but also reduces the overall amount of current required during a writing procedure.

SUMMARY OF THE INVENTION

The problems outlined above may be in large part addressed by a memory cell and method for improving the write selectivity of individual memory cells in an MRAM array. In particular, the above problems may be addressed by a memory cell having at least one magnetic layer with a shape that is substantially asymmetrical about at least one axis of the magnetic layer. Such asymmetry may advantageously increase the write selectivity of individual cells within an MRAM array by reducing and/or eliminating the effects due to variations in the fabrication process. Such process variations may result in, for example, variations in shape and size of the magnetic layer, as well as the presence of defects on/within the magnetic layer. In addition, an asymmetrical memory shape tends to induce a relatively consistent equilibrium vector state, due to its insensitivity to variations in shape and size. Such a consistent equilibrium state allows a single switching mechanism to set the magnetic direction of the cell. As a result, the variation in current used to write an asymmetrical memory cell may be less than the current used to write a symmetrical memory cell. Furthermore, a method is provided herein for programming a memory cell, in which the amount of current needed during a writing procedure is advantageously reduced relative to the amount of current needed in conventional writing procedures. In this manner, the asymmetrical memory cell and method produces a storage medium having overall power requirements less than those associated with symmetrical memory cells.

As stated above, a memory cell having at least one magnetic layer with a shape that is substantially asymmetrical about at least one axis of the magnetic layer is provided herein. In some cases, the memory cell may include a plurality of layers having shapes substantially similar to the asymmetrical shape of the magnetic layer. In such a case, the plurality of layers may include a portion of the layers within a memory cell stack. In other cases, however, the plurality of layers may include all of the layers within a memory cell stack. In one embodiment, the memory cell has an asymmetric configuration about a first axis (e.g., the magnetic easy axis direction). More specifically, one or more layers of the memory cell may have an asymmetric configuration about a first axis of the memory cell. In some cases, the first axis may be arranged along the length, or an elongated dimension of the memory cell.

In an alternative embodiment, the memory cell may have an asymmetric configuration about a second direction (e.g., the magnetic hard axis direction), such that the second direction is perpendicular to the first direction. In some cases, such a second direction may be arranged along the width, or a shortened dimension of the memory cell. In either case, a memory cell is provided having at least one magnetic layer with a shape that is substantially asymmetrical about at least one dimension of the magnetic layer. In yet another embodiment, the memory cell may have an asymmetric configuration about both the first and second directions. In this manner, the shape of the magnetic layer may be asymmetrical along an elongated dimension of the memory cell in addition to a dimension perpendicular to the elongated dimension.

In any case, the shape of the asymmetric memory cell may include a curved portion along at least one side of the memory cell, in some embodiments. As such, the curved portion may be aligned with the axis (or axes) in which the asymmetry resides. For example, the asymmetric configuration (or shape) of the memory cell may include a curved portion along at least one side of the memory cell, which is substantially aligned with the elongated dimension of the memory cell. Alternatively, the asymmetric configuration of the memory cell may include a curved portion, which is substantially aligned with the shortened dimension of the memory cell. Such asymmetry (whether about the easy axis, hard axis, or both axes) advantageously decreases the sensitivity of the memory cell to defects, as well as to variations in shape and size, since the shape of the memory cell (i.e., dot) sets the reversal of magnetization.

In some embodiments, the magnetic memory cell may include a magnetic layer with a perimeter having a larger curvature along one side of the perimeter than an opposing side of the perimeter. In such an embodiment, the opposing side of the perimeter may have a curvature, which is concave or convex, or alternatively, the opposing side may be substantially straight. In some cases, the one side of the perimeter may include a curved portion having a different radial length than other curved portions arranged along the one side of the perimeter. In other cases, however, the one side of the perimeter may include a curved portion having a single radial length. In any case, the one side and the opposing side of the perimeter may be arranged along the length, or along an elongated dimension of the magnetic layer. Alternatively, the one side and the opposing side of the perimeter may be arranged along the width, or along a shortened dimension of the magnetic layer.

A method for programming a magnetic memory cell is also provided herein. Such a method may be used to reduce the amount of current needed to write information to a memory cell by enforcing a destabilizing magnetic vector state (or magnetic vector field pattern) within the memory cell prior to setting the magnetic direction of the cell. In particular, the method may include destabilizing a magnetic vector state of a selected memory cell with a first magnetic field by applying current to a first conductive line. During such a step, the first magnetic field may be along a direction that is transverse to an overall direction of the magnetic vector field pattern of the selected memory cell. Such an overall direction may be a direction associated with a majority of the magnetic vectors arranged within the memory cell.

In one example, the current applied to the first conductive line during the step of destabilization may be along a direction of the first conductive line that is substantially aligned with the direction of the majority of magnetic vectors arranged within the memory cell. In an alternative example, the current may be applied to the first conductive line along a direction substantially opposite to the direction of the majority of magnetic vectors. Such an alternative example, however, would result in a higher switching field. In either embodiment, the method may further include setting a magnetic direction (or magnetic state) of a selected memory cell with a second magnetic field induced by a current applied to the first conductive line and a current applied to a second conductive line. As such, the second magnetic field is a combined magnetic field, which is induced by the currents applied to both the first and second conductive lines. After setting the magnetic state of the memory cell, the method may include stabilizing the magnetic vector field pattern of the selected memory cell along the set magnetic direction with a magnetic field induced by the current applied to the second conductive line. During such a stabilizing step, the current applied to (the first conductive line may be reduced, or alternatively, may be discontinued altogether.

In some cases, the magnetic memory cell may also be aligned with other memory cells in an array configuration. As such, the step of destabilizing may also include destabilizing the magnetic vector states of the other memory cells spaced above the first conductive line. In such a case, the method may include re-stabilizing the magnetic vector states of the other memory cells subsequent to the step of setting the magnetic direction of the selected memory cell. Such a re-stabilizing step may include discontinuing the current applied to the first conductive line. In another embodiment, the method may not discontinue the current applied to the first conductive line completely, but instead, may reduce the current applied to the first conductive line until the induced magnetic field decreases to a point in which the magnetic vector states of the memory cells are re-stabilized. In either embodiment, the step of re-stabilizing may include discontinuing (or reducing) the current applied to the first conductive line prior to discontinuing the current applied to the second conductive line. Alternatively, the method may include discontinuing (or reducing) the current applied to the first conductive line at approximately the same time as discontinuing the current applied to the second conductive line. Thus, the magnetic state of the memory cell may be stabilized and maintained even after current is completely removed from the vicinity of the memory cell. As such, the asymmetrical MRAM cell and method produces a non-volatile storage medium having overall power requirements less than those associated with symmetrical memory cells.

A method for forming a magnetic field is also provided herein. Such a method may include forming a portion of the magnetic field in an arcuate pattern along a first periphery, while simultaneously forming another portion of the magnetic field in a linear pattern along an opposed, second periphery. After the forming step, the method may include an additional forming step in which another portion of the magnetic field is formed in an arcuate pattern partially along both the first and second peripheries. Next, the method may include reversing a magnetic direction of the arcuate pattern is formed along both the first and second peripheries. After the reversing step, the method may include altering the arcuate pattern formed along the first and second peripheries to form a different pattern. In this manner, the different pattern may include another arcuate pattern along the first periphery and another substantially linear pattern along the second periphery.

Incorporated by reference is a twenty-one (21) page appendix describing further the details of the present embodiments.

BRIEF DESCRIPTION OF THE DRAWINGS

Other objects and advantages of the invention will become apparent upon reading the following detailed description and upon reference to the accompanying drawings in which:

FIG. 2E is a top view of one or more memory cell layers in which an opposing side of the asymmetrical perimeter has a curvature that is substantially convex;

FIG. 2F is a top view of one or more memory cell layers in which at least one side of the perimeter may include one or more curved portions having one or more radial lengths;

FIG. 3 is a transitional magnetic vector diagram illustrating an exemplary reversal mechanism for a disturbed memory cell in which current is flowing along only one conductive path;

FIG. 4 is a transitional magnetic vector diagram illustrating an exemplary reversal mechanism for a selected memory cell in which current is flowing along two conductive paths;

FIG. 6 is a table illustrating the difference in current requirements for writing to an elliptically shaped memory cell and for writing to an asymmetrically shaped memory cell for both select and disturb cells;

FIG. 12A illustrates one embodiment of FIG. 2A in which an asymmetrical cell shape is produced by a photolithography mask having a first pattern;

FIG. 12B illustrates an alternative embodiment of FIG. 2A in which an asymmetrical cell shape is produced by a photolithography mask having a second pattern;

FIG. 12C illustrates another alternative embodiment of FIG. 2A in which an asymmetrical cell shape is produced by a photolithography mask having a third pattern; and FIG. 12D illustrates yet another alternative embodiment of FIG. 2A in which an asymmetrical cell shape is produced by a photolithography mask having a fourth pattern.

Figure 1A:
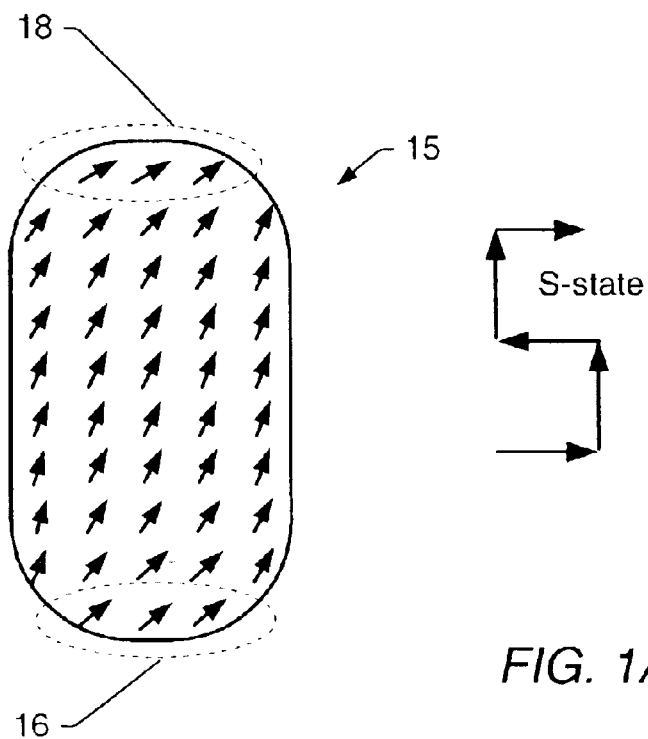
FIG. 1A is a magnetic vector diagram illustrating an S-shaped equilibrium vector state within an elliptically shaped memory cell.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

In a non-volatile magnetic memory, such as a magnetic random access memory (MRAM), each magnetic memory cell in a memory array includes a small magnetic element based on a magnetic tunnel junction (MTJ) or a spin valve structure, and is coupled to a digit line and a bit line. Such a memory cell structure (herein referred interchangeably as an MRAM cell, a magnetic stack, or a dot) typically includes a tunneling barrier layer and at least two magnetic layers, such that an upper magnetic layer (e.g., a free magnetic layer or storage layer) is arranged above, and a lower magnetic layer (e.g., a pinned magnetic layer) is arranged below, the tunneling barrier layer. Alternatively, the structure of the memory cell may be "flipped," such that the pinned magnetic layer is arranged above, and the free magnetic layer is arranged below, the tunneling barrier layer. For the sake of simplicity, however, the memory cell structure will be described herein as including a free, upper magnetic layer and a pinned, lower magnetic layer.

The MRAM cell employs tunnel magneto-resistance for operation. In other words, the lower magnetic layer of an MRAM cell is pinned, such that the election spill of the pinned magnetic layer is fixed in a particular direction (either up or down). Such a fixed electron spin typically results in a fixed magnetic direction for the pinned magnetic layer. On the other hand, the electron spin of the storage layer is free to change between up and down states. Thus, the storage layer is capable of altering between parallel and anti-parallel magnetic directions relative to the magnetic direction of the lower magnetic layer. In this manner, when the electron spins of the storage and pinned magnetic layers are aligned in the same direction (i.e., magnetic direction of the storage layer is parallel to the magnetic direction of the pinned magnetic layer), the electrons tunneling through the tunneling barrier layer will experience relatively little scattering, and thus, the memory cell will exhibit a relatively low resistance. Alternatively, the electron spins are misaligned when the magnetic direction of the storage layer is opposite (i.e., anti-parallel) to the magnetic direction of the pinned magnetic layer. In such a case, the tunneling electrons will experience relatively more scattering and the memory cell will exhibit a relatively higher resistance.

In general, the reading and writing operations are defined by the magnitude and direction of the magnetization in the storage layer of a selected memory cell with respect to the magnetization in the pinned magnetic layer. To set the magnetization along one direction at rest, an easy axis of the magnetization is induced by the magnetic tunnel junction shape (i.e., magnetic stack or dot shape). In other words, the shape of the memory cell induces an internal magnetic field, which tends to naturally arrange itself along a dimension of the memory cell without the influence of an external magnetic field. Such a dimension is herein referred to as the easy axis of magnetization.

More specifically, the internal magnetic field within a particular layer of an MRAM cell is composed of a plurality of individual magnetic field vectors, the vector sum of which determines the overall magnetic direction of the layer. In an equilibrium state (i.e., when no external magnetic field is applied), the individual magnetic field vectors align naturally along directions parallel to the lateral periphery of the magnetic layer. This innate alignment produces a vector field pattern, which approximately follows the shape of the memory cell. Such a vector field pattern is herein referred to as an equilibrium vector state. Since substantially no external energy is required to produce such an equilibrium vector state, the direction represented by the vector sum of the individual magnetic field vectors is designated as the easy axis of magnetization. On the other hand, the hard axis of magnetization may be designated as the direction perpendicular to the easy axis of magnetization.

In most cases, a memory cell having easy axis and hard axis orientations usually exhibits an aspect ratio larger than 1.0. Since the aspect ratio is described herein as the ratio between the length and width of a single memory cell, an aspect ratio larger than 1.0 indicates that the length of the memory cell is larger than the width of the memory cell. In such an embodiment, the length of the memory cell may pertain to the easy axis and the width of the memory cell may pertain to the hard axis of magnetization. Furthermore, both logic 0 and logic 1 states may be defined by the magnetic direction of the memory cell during reading as well as writing operations. In some cases, the magnetic direction may be defined along the length of the memory cell (i.e. easy axis of the magnetization). Alternatively, the magnetic direction may be defined along the width of the memory cell (i.e. hard axis of magnetization). Such a case, however, may be undesirable since an external magnetic field may be needed to orient the magnetization along the hard axis, thereby increasing the amount of power consumed by the memory circuit. In any case, the magnetic directions of the logic 0 and logic 1 states are typically oriented 180 degrees from each other.

In most cases, an MRAM array includes a first set of parallel electrically conductive lines (e.g., digit lines) and a second set of parallel electrically conductive lines (e.g., bit lines). Bit lines are usually oriented perpendicular to digit lines, such that individual memory cells within the MRAM array are located at the intersection regions between the intersecting bit lines and digit lines. During a read operation, current is applied only to the bit line corresponding to the column in which the selected memory cell lies. During a write operation, however, current is applied to both the digit line and the bit line associated with the selected memory cell. Together, these currents produce a magnetic field in the vicinity of the selected memory cell, which is a vector sum of the individual bit line and digit line magnetic fields.

In the case that identical currents are applied to both the bit line and the digit line, the vector sum of the bit line and digit line magnetic fields will be larger, in one example, by approximately a factor of a square root of two (i.e., SQRT (2)) than a magnetic field obtained solely by a bit line current or a digit line current. However, in the case that the current applied to the selected bit line is not identical to the current applied to the digit line, the combined magnetic field at the selected memory cell may be smaller or larger than SQRT(2) over a magnetic field obtained solely by a bit line current or a digit line current. This concept defines how selectivity of the writing operation is provided by the magnetic memory cell.

The margin of write selectivity between the select and disturbed cells is defined by two characteristics. One characteristic is the difference in the magnitude and direction of the external magnetic fields sensed by the select and disturbed cells. In other words, a selected cell should encounter a substantially larger external magnetic field than a disturbed cell, since a selected cell receives a combined magnetic field produced by current applied to both the bit line and the digit line associated with the selected cell. A disturbed cell, on the other hand, generally receives a substantially smaller magnetic field produced by current applied to the bit line or current applied to the digit line.

Another characteristic defining write selectivity may be the difference in switching fields between select and disturbed cells. A switching field, as described herein, is the magnitude and direction of a magnetic field needed to switch a memory cell from one magnetic state to an opposite magnetic state, such as between parallel and anti-parallel magnetic directions. The margin of write selectivity, however, is usually affected by variations in the magnetic fields produced within the memory cells (i.e., internal magnetic fields). Such variations in magnetic fields are mainly due to variations in size and shape of the individual memory cells within the memory array. In addition, defects in a memory cell may also cause variations in the magnetic fields within individual memory cells. Therefore, it may be beneficial to provide a memory cell having a configuration that is less sensitive to variations in magnetic fields to allow for an increased margin of write selectivity. Such an increased margin would preferably induce repeatable switching characteristics for each memory cell within the array. In other words, it would be desirable to have switching characteristics, which are the same for all memory cells in the array.

To allow repeatable switching characteristics for each cell within the array, the switching mechanism for the reversal of magnetization should be the same for all memory cells. A switching mechanism, as described herein, is a process that causes the internal magnetization of the memory cell to rotate from a first direction (e.g., parallel) to second direction usually oriented 180 degrees from the first direction (e.g., anti-parallel). In this manner, the rotation of the internal magnetization from one direction to an opposite direction is typically referred to as a reversal of magnetization.

In principle, the switching mechanism for the reversal of magnetization within a memory cell can follow three different mechanisms: reversal through wall motion, coherent rotation of magnetization, or reversal of magnetization through vortex formation and annihilation. First, reversal through wall motion is a switching mechanism that is driven by the formation of domains, or segments having magnetic directions oriented 180 degrees from one another. Reversal through wall motion does not usually allow a repeatable switching mechanism due to its extreme sensitivity to pinning defects, which may cause large variations in the switching fields from memory cell to memory cell. However, in the case that the long axis dimension of a memory cell is smaller than 1 $\mu$m, no domain walls will be formed (thus, resulting in a single domain structure) and the reversal mechanism will follow either a reversal of magnetization through vortex formation and annihilation or coherent rotation of magnetization, as will be described in more detail below.

As stated above, the easy axis of magnetization is an inherent result of the shape of an MRAM cell. As such, the magnetic state of the memory cell is generally determined by the magnetic direction along the easy axis of the free magnetic layer. Thus, the shape of an MRAM cell directly influences the operating characteristics of the memory cell. For example, a particular memory cell shape, such as an elliptic shape, may naturally induce an equilibrium vector field pattern (i.e., equilibrium vector state) resembling an S-shape, as described below in reference to FIG. 1A. Such an S-shaped pattern, or S-state, usually requires a relatively low external magnetic field to switch (i.e., reverse) the magnetic state of the cell. Therefore, the S-state may be alternatively referred to as a low switching field state.

The same memory cell shape, however, may sometimes induce an equilibrium vector field pattern resembling an altogether different shape, such as a C-shape, which may require a substantially larger external magnetic field to switch the magnetic state of the cell, as described below in reference to FIG. 1B. In this manner, an elliptically shaped MRAM cell may also induce a C-state, otherwise referred to as a high switching field state, which is relatively more stable than an S-state. Thus, an MRAM circuit including a plurality of similarly shaped memory cells may function inconsistently when a portion of the memory cells requires a higher switching field than other memory cells. Such inconsistency ultimately results in failure of the MRAM circuit to maintain accurate information by reducing the write selectivity, or the difference between the current responsible for switching a disturbed cell and the current needed to switch a selected cell.

Figure 1B:
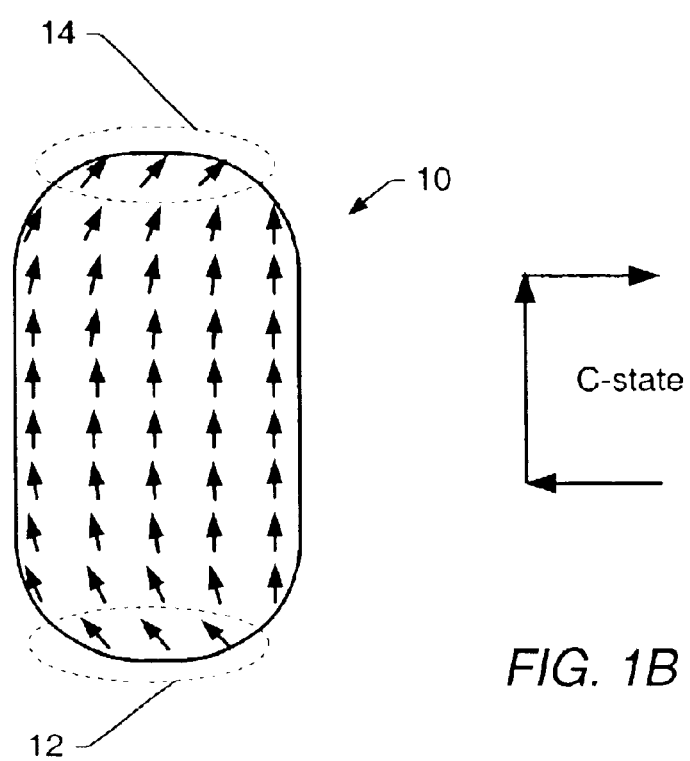
FIG. 1B is a magnetic vector diagram illustrating a C-shaped equilibrium vector state within an elliptically shaped memory cell.

Turning now to the drawings, FIG. 1B illustrates an equilibrium vector state (i.e., an internal magnetic vector field pattern at rest), which facilitates a reversal of magnetization through vortex formation and annihilation. To enforce this mechanism, the internal magnetization needs to be in the so-called "C" equilibrium state prior to reversal. In particular, FIG. 1B depicts symmetrically shaped (e.g., an elliptically shaped) memory cell 10, in which the internal magnetization tends to follow a circular pattern driven by the geometry of the dot, or memory cell. As shown in FIG. 1B, the longitudinal end vectors 12 and 14 are oriented in directions that are substantially opposed to one another. In this manner, an elliptically shaped memory cell may induce a C-shaped equilibrium vector state, or C-state. As stated above, the C-state typically requires a substantially higher magnetic field to switch the magnetic direction of a memory cell. Thus, a C-state tends to be a relatively stable vector state, and is usually referred to as a high switching field state.

However, due to variations in the fabrication process, reversal of magnetization could unintentionally occur in a disturbed memory cell having an equilibrium C-state. Such process variations, for example, may result in cell variations including shape, size, and/or the presence of defects. As such, a reversal of magnetization through vortex formation and annihilation is the switching mechanism typically responsible for the unintentional reversal of disturbed memory cells arranged along the bit line corresponding to the selected memory cell. The reversal of magnetization through vortex formation and annihilation requires larger switching field amplitudes than the coherent rotation procedure (e.g., between 25% to 50% larger) described below. Therefore, vortex formation and annihilation may not be the switching mechanism typically responsible for the reversal of magnetization of selected memory cells, since selected memory cells are affected by a combined magnetic field.

On the other hand, FIG. 1A illustrates an alternative equilibrium vector state within elliptically shaped memory cell 15, which facilitates a switching mechanism through coherent rotation of magnetization. To enforce this switching mechanism, however, the internal magnetization needs to be set in the so-called S-state, or selecting state, as shown in FIG. 1A. In particular, FIG. 1A depicts symmetrically shaped (e.g., an elliptically shaped) memory cell 15, in which the internal magnetization tends to follow an S-shaped pattern. As stated above, such a pattern is generally driven by the geometry of the dot, or memory cell. As shown in FIG. 1A, longitudinal end vectors 16 and 18 are oriented in approximately the same direction. In this manner, an elliptically shaped memory cell may alternatively induce an S-shaped equilibrium vector state, or S-state. In general, the S-state typically requires lower switching field amplitudes, and thus, is sometimes referred to as a low switching field state. Therefore, coherent rotation of magnetization is usually the switching mechanism used during write operations to a selected memory cell.

A major disadvantage of using a symmetrically shaped memory cell, and more specifically an elliptic cell shape, is that a symmetrical shape is very sensitive to variations in size, shape and defects. As a result, one or more cells in an array of symmetrically shaped memory cells may induce different equilibrium vector states. As such, the different equilibrium vector states may produce switching mechanisms that differ significantly from cell to cell. For example, variations in size, shape, and the presence of local defects at the edges of a symmetrical memory cell, are likely to randomly set the equilibrium vector state (i.e., magnetic field vector state at rest) in either the S-state or the C-state, as shown in FIGS. 1A and 1B, respectively. Consequently, the use of symmetrically shaped memory cells is likely to produce at least some variation in the switching fields associated with the individual cells in a memory array. The variation in switching fields may be so large that it becomes difficult to write to a selected cell without affecting the magnetic state of half selected cells. As noted above, half selected cells or disturbed cells, are located along either the bit line or the digit line of the selected cell, and sense only one magnetic field. The problem is likely to become more severe as the size of the memory cells decrease, since a decrease in cell size leads to relatively larger variations in shape and size between the individual cells within a memory array.

Thus, it may be beneficial to provide a memory cell that overcomes the disadvantages described above. Consequently, a memory cell is provided having an asymmetrical configuration. In some cases, the asymmetrical memory cell would avoid large discontinuities of local magnetic vectors at the edges of the memory cell by including smoothly curved edges, as shown in FIGS. 2A–F. In this manner, smooth edges may prevent undesirable fluctuations in the switching fields of the memory cells. In other words, the amount of current needed to produce an external magnetic field large enough to switch the magnetic direction of a layer of the memory cell (i.e., the switching field) may fluctuate due to the formation of magnetic singularities (i.e., large discontinuities of local magnetic vectors) within the memory cell. Due to the accumulation of electrical charge, these magnetic singularities typically form in areas of a memory cell that exhibit sharp corners. In this manner, magnetic singularities tend to alter the internal magnetization of the cell layer, thereby altering the resistance of the cell layer. Thus, a memory cell having an asymmetrical configuration and smooth edges will prevent large magnetic vector disorientation, or magnetic singularities, which would otherwise disadvantageously affect the tunnel magneto-resistance signal of the memory cell.

In addition, an asymmetrical shape may produce switching fields less sensitive to variations in shape and size than conventional elliptically shaped memory cells. Furthermore, an asymmetrical shape may be additionally insensitive to the presence of defects. Moreover, an asymmetrical shape may advantageously set the magnetic direction of a memory cell with the use of a single switching mechanism. In this manner, the asymmetrical shape of the memory cell advantageously reduces the current needed for switching a selected cell, reduces the distribution of the switching fields, and increases the selectivity of the writing operation.

FIGS. 2A–F illustrate exemplary embodiments of a memory cell layer having an asymmetrical shape along at least one dimension of the layer. In some cases, the structures shown in FIGS. 2A–F may include a plurality of cell layers where at least one of the layers comprises a magnetic field. It may be advantageous, however, for at least two of the plurality of cell layers to comprise magnetic fields. For instance, a lower magnetic layer, or pinned magnetic layer, may exhibit a fixed magnetic direction, whereas an upper magnetic layer, or storage layer, may exhibit a variable magnetic direction. In such an embodiment, the plurality of cell layers may comprise an entire memory cell. Alternatively, the plurality of cell layers may comprise a portion of the memory cell layers. In yet another embodiment, the structures shown in FIGS. 2A–F may only include a single magnetic layer of a memory cell. In such an embodiment, the magnetic layer is preferably the storage or free magnetic layer.

In general, the one or more layers depicted in FIGS. 2A–F may have a profile with which the layers can be rotated about an axis, such that the layers demonstrate an asymmetrical configuration about the axis. In this manner, each of the layers within a memory cell may exhibit the same asymmetrical configuration. Alternatively, one or more of the layers may exhibit asymmetrical configurations different from the asymmetrical configurations of other layers within the cell. In yet other embodiments, not all cell layers may exhibit asymmetrical configurations. For example, only one cell layer, such as the storage layer, may exhibit an asymmetrical configuration, whereas one or more other cell layers may exhibit a substantially symmetrical configuration. In another example, a number of cell layers (greater than one but less than all) may demonstrate an asymmetrical configuration.

Figure 2A:
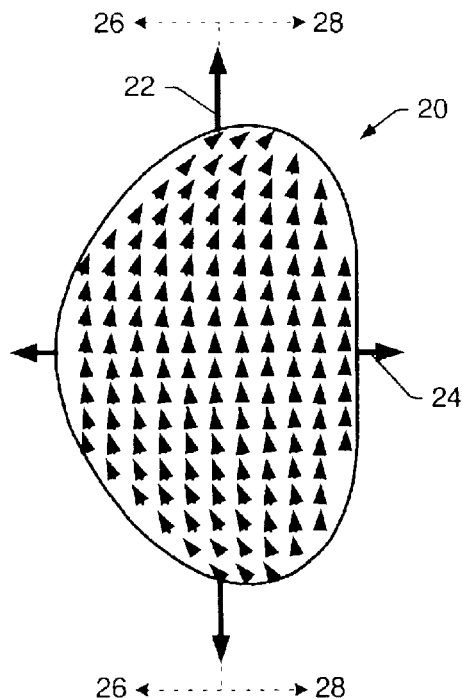
FIG. 2A is a top view of one or more memory cell layers having an asymmetrical configuration about a longitudinal axis.

In the embodiment shown in FIG. 2A, the asymmetrical configuration of the one or more cell layers 20 is preferably arranged about the easy axis of magnetization 22 (i.e., long axis of the dot). More specifically, the portion of the one or more cell layers to the left of axis 22 is not symmetrical to the portion of the one or more cell layers to the right of axis 22. As noted above, the easy axis of magnetization is typically arranged along the length (i.e., elongated dimension) of the one or more cell layers, as opposed to the width (i.e., shortened dimension) of the one or more cell layers. This allows the asymmetry to enforce the C-shape at the expense of the S-shape. In other words, the memory cell of FIG. 2A has an asymmetrical configuration that typically induces an equilibrium vector state having a C-shape instead of an S-shape. Since the equilibrium vector state follows the shape of the cell perimeter, the sum of the individual magnetic vectors tends to align in a direction along the easy axis of magnetization. As a result, the C-shape is, by nature, very insensitive to variations in shape, size, and the presence of defects. Consequently, adding local defects at the edges or changing the shape or the curvature of one or more cell layers 20 does not affect the magnetic state at rest.

Figure 2B:
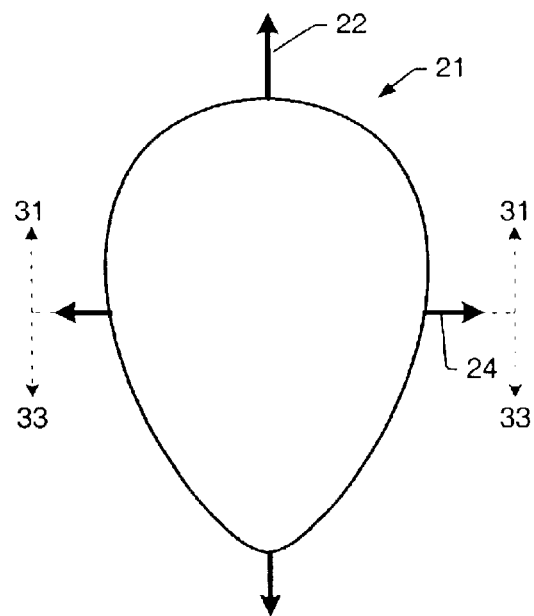
FIG. 2B is a top view of one or more memory cell layers having an asymmetrical configuration about a transverse axis.
Figure 2C:
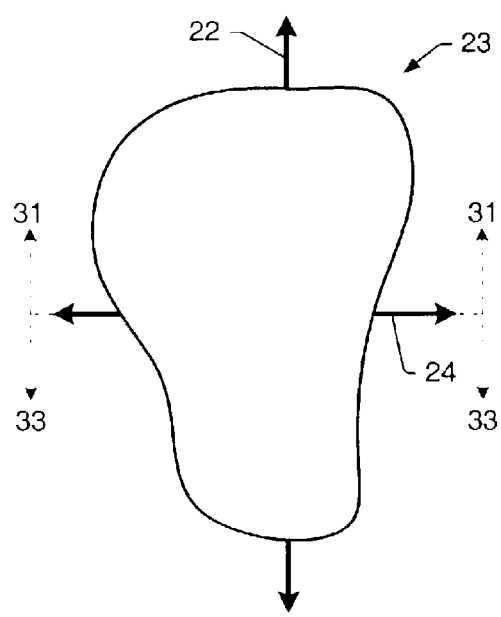
FIG. 2C is a top view of one or more memory cell layers having an asymmetrical configuration about a longitudinal axis and a transverse axis.

FIG. 2B depicts an alternative embodiment, in which the one or more cell layers 21 may be rotational about a second axis 24 perpendicular to the first axis, such that the one or more cell layers demonstrates on asymmetrical configuration when rotated about the second axis. In other words a portion of one or more cell layers 21 above axis 24 is not symmetrical to a portion of the one or more cell layers below axis 24. In such an alternative embodiment, the asymmetrical configuration of the one or more cell layers is about the hard axis of magnetization 24 (i.e., short axis of the dot). FIG. 2C illustrates yet a further embodiment, in which one or more cell layers 23 may demonstrate an asymmetrical configuration when rotated around both the first and second axes, herein denoted as the easy axis and hard axis, respectively. In such an embodiment, portions of one or more cell layers 23 above axis 24 and to the right of axis 22 are not symmetrical to portions of the one or more cell layers below axis 24 and to the left of axis 22, respectively.

Figure 2D:
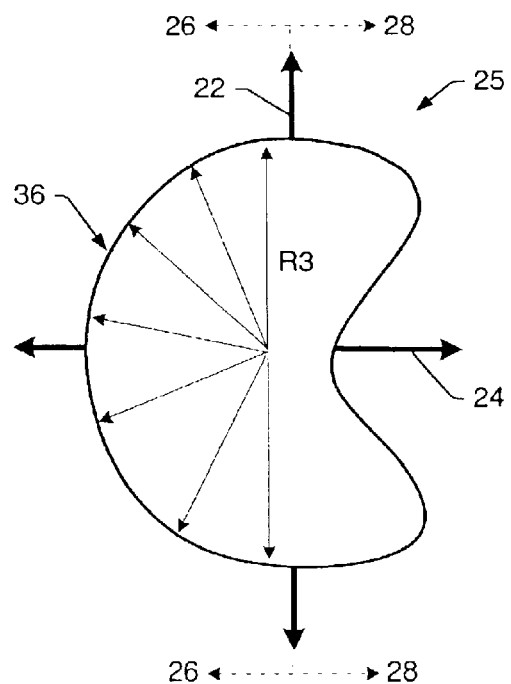
FIG. 2D is a lop view of one or more memory cell layers in which an opposing side of the asymmetrical perimeter has a curvature that is substantially concave.

FIGS. 2D–F illustrate additional exemplary embodiments of asymmetry about the easy axis and/or the hard axis of magnetization. In particular, FIGS. 2D–F illustrate one or more cell layers 25, 27, and 29, respectively, having an asymmetrical shape along at least one dimension. As such, the shapes shown in FIGS. 2D–F may offer similar advantages over symmetrically shaped memory cells as the shapes shown in FIGS. 2A–C. It is noted, however, that the shapes shown in FIGS. 2A–F are exemplary embodiments of an asymmetrical shape and are not shown to exclude other asymmetrical shapes from being used for one or more layers of a memory cell. As such, a plurality of other shapes that are asymmetrical along at least one dimension may be used for the device described herein.

In any embodiment, the one or more cell layers shown in FIGS. 2A–F may include an asymmetrical perimeter having a larger curvature along one side of the perimeter than an opposing side of the perimeter. Such opposing sides of the perimeter may be about the axis of asymmetry, and arranged along different portions of the perimeter depending on the shape of the memory cell. For example, FIG. 2A includes side 26 having a larger curvature than opposing side 28. In such an embodiment, side 26 may refer to the side of the perimeter extending to the left of axis 22, while opposing side 28 may refer to the side of the perimeter extending to the right of axis 22. In this manner, sides 26 and 28 may be arranged along the length, or elongated dimension of one or more layers 20. In addition, the lateral extents of side 26 and opposing side 28 may be bound by the poles of axis 22. Alternatively, the lateral extents of side 26 and/or opposing side 28 may extend along portions of the perimeter extending between the poles of the axis 22. Other embodiments illustrating differences in curvature to the left and right of axis 22 are shown in FIGS. 2D–2F as well.

In some embodiments, opposing side 28 may include a larger curvature than side 26. Although the curvatures of the shapes shown in FIGS. 2D–2F are different from each other and FIG. 2A, references to side 26 and opposing side 28 are used for each embodiment to specify a portion of the perimeter extending between poles of axis 22 on respective sides of the axis. In general, curvature size may be proportional to the radial length of a curve. The radial length of a curve may be the distance between the curve perimeter and the central point about which it extends. A further explanation of the relation of radial length to curvature is described below.

In another example, FIGS. 2B–C each include side 31 having a larger curvature than opposing side 33. In such an embodiment, side 31 may refer to the side of the perimeter extending above axis 24, while opposing side 33 may refer to the side of the perimeter extending below axis 24. In this manner, sides 31 and 33 may be arranged along the width, or shortened dimension of one or more layers 21 and 23. In addition, the lateral extents of side 31 and opposing side 33 may be bound by the poles of axis 24. Alternatively, the lateral extents of side 31 and/or opposing side 33 may extend along portions of the perimeter extending between the poles of the axis 24. In other embodiments, however, opposing side 33 may include a larger curvature than side 31.

In some cases, one side of the perimeter may include a curved portion having a different radial length than other curved portions arranged along the same side of the perimeter. FIG. 2F, for example, illustrates side 26 including curved portion 32 having a different radial length than curved portion 34. The radial lengths of curved portions 32 and 34 may be designated as R1 and R2, respectively. As stated above, the radial length of a curve may be the distance between the curve perimeter and the central point about which it is extends. Using such a definition, a curve may refer to a portion of a circumference of a circle. Consequently, the distances between different points along the curve and a shared central point may be substantially equal. For example, the distances between points along side 26 in the region of curve portion 32 and a shared central point may be substantially equal, as shown in FIG. 2F. Such a distance, therefore, may refer to the radial length of the curve. In general, curvature size is proportional to the radial length of the curve. More specifically, a larger radial length of the curve may result in a larger curvature of the curve. Consequently, curved portion 34 in FIG. 2F is shown to have a larger curvature than curved portion 32. In general, the descriptions of curvature and radial length may apply to both concave and convex curves. As such, the concave portion along side 26 and the convex portion along side 28 of FIG. 2F maybe compared using such definitions of curvature and radial length to determine that side 26 has a larger curvature than side 28. FIG. 2D illustrates an embodiment in which the shape includes a single curved portion along one side of the perimeter. In particular, FIG. 2D illustrates curved portion 36 as having radial length R3 along side 26.

In addition, the nature of the curvature along either side of the cell perimeter may affect the switching field of selected memory cells within an array. For example, FIG. 2D illustrates that the opposing side of the asymmetrical perimeter may have a curvature that is substantially concave. As shown in FIG. 2D, such a concave curvature may induce a relatively stronger C-state than the C-state shown in FIG. 2A. In this manner, a selected memory cell as shown in FIG. 2D may require larger switching fields, and hence higher levels of applied current, than a selected memory cell as shown in FIG. 2A. On the other hand, FIG. 2E illustrates that opposing side 28 of the asymmetrical perimeter may have a curvature that is substantially convex. Such a convex curvature may induce a relatively weaker C-state than the C-state shown in FIG. 2A. As such, a selected memory cell as shown in FIG. 2E may require relatively smaller switching fields, and hence lower levels of applied current, than a selected memory cell as shown in FIG. 2A. Alternatively, opposing side 28 may be substantially straight as shown in FIG. 2A and described above. In general, the curvatures of sides 26 and 28 may be optimized for particular current requirements, depending on the design specifications of the device.

In a preferred embodiment, the one or more layers may be shaped to include an elongated dimension and a shortened dimension, such that the elongated and shortened dimensions are arranged perpendicular to one another. In general, the dimensions of the one more layers may vary between embodiments, depending on the design specifications of the device. For example, in some embodiments, the width of the one or more cell layers may vary between approximately 50 nm and approximately 800 nm, or more specifically between approximately 400 nm and approximately 600 nm. In addition, the length of the one or more cell layers may vary between approximately 100 nm and approximately 1100 nm, or more specifically between approximately 500 nm and approximately 900 nm. In one example, the one or more cell layers have a width of about 400 nm and a length of about 640 nm, to result in an approximate aspect ratio (i.e. length versus width) of 1.6. However, the dimensions of the one or more cell layers are not restricted to the values provided herein. In particular, smaller or larger dimensions of the one or more cell layers may be used for the asymmetrically shaped cell described herein. In addition, the dimensions of the one or more cell layers are not restricted to having an aspect ratio of approximately 1.6, as provided in the above example. Instead, the cell aspect ratio may be any value approximately greater than or equal to 1.0.

The asymmetrical configuration of the memory cell (as shown in the embodiments of FIGS. 2A–F) advantageously increases the operation window for the writing procedure without affecting the disturbed memory cells. In other words, an array including asymmetrical memory cells experiences a substantial increase in write selectivity over an array including substantially symmetrical memory cells, such as elliptically shaped cells. As noted above, the write selectivity is related to the current margin between the minimum amount of current responsible for switching a half selected (i.e., disturbed cell) and the amount of current needed to switch a selected cell. Micro-magnetic calculation of select and disturb bits has shown that write selectivity increases drastically with the use of an asymmetric shape.

As an example, FIG. 6 reports the marginal currents calculated for switching an exemplary symmetric (e.g., elliptic) shaped memory cell and an exemplary asymmetric shaped memory cell, taking into account variations in shape and size. Both shapes have nominal dimensions of width= 400 nm, length=640 nm and an approximate aspect ratio of 1.6. As can be seen in FIG. 6, the write selectivity (i.e., operation window for writing) of an asymmetric shape increases from 0.8 mA (for an elliptic shape) to 3 mA (for an asymmetric shape). Such an increase in the current margin for the case of the asymmetrical shape illustrates the benefit of this new shape. For example, the asymmetrical cell shape increases the margin between the amount of current needed to program a selected cell and the amount of current responsible for unwittingly programming another cell arranged along the same bit line or digit line (i.e. disturbed cell). Thus, the asymmetrical cell shape greatly increases the write selectivity, thereby reducing the possibility of writing to a disturbed, or unintended memory cell.

In addition, FIG. 6 shows that an asymmetric shape requires less variation in current, as well as less overall current, than a symmetric shape during the writing operation. In the case of an elliptically shaped cell, the current variation in writing to a selected cell may be 2.2 mA, or the difference between the current needed to program the hardest bit (4.2 mA) and the current needed to program the easiest bit (2 mA). As noted above, a memory cell arranged along the selected bit line or digit line may have a configuration which requires significantly higher switching fields than other memory cells arranged along the same bit line or digit line. Such a memory cell is typically 'hard' to write, and therefore may be referred to as the hardest bit. On the other hand, the easiest bit refers to the memory cell arranged along the selected bit line or digit line, which has a configuration that requires a significantly lower switching field. In an asymmetrically shaped cell, however, the current variation in writing to a selected cell is significantly less (e.g., 3 mA–1.3 mA=1.7 mA) than the current variation in writing to an elliptically shaped selected cell. The current variation in writing to a disturbed cell is also less for an asymmetrically shaped cell versus an elliptically shaped cell.

In either case (i.e., writing to selected or disturbed cells), the decreased current variation in the asymmetrically shaped cell may be a result of the asymmetrical cell's insensitivity to variations in shape, size, and defects. In other words, the asymmetrically shaped cell experiences substantially less variation between easy and hard bits, and thus requires less variation in current, as a result of its decreased sensitivity to the above mentioned variations. Furthermore, the overall current needed to write to a selected cell is substantially less for an asymmetrical configuration as opposed to a symmetrical configuration. Therefore, an asymmetrical cell shape advantageously consumes less power than a symmetrical cell having similar nominal dimensions and material compositions. It is noted that the current ranges shown in FIG. 6 are provided as exemplary embodiments, and that the current values for the asymmetrical memory cell are not restricted to the embodiments shown.

FIGS. 3 and 4 depict transitional magnetic vector diagrams illustrating exemplary switching mechanisms for both disturbed and selected cells, respectively, having asymmetrical shapes as described herein. As already mentioned above, the switching field is driven by the switching mechanism for the reversal of magnetization. In an embodiment in which the size of a memory cell is less than 1 $\mu$m, only single domain structures are expected, and as a consequence, either coherent rotation of magnetization (REVERSAL A, FIG. 4) or flux closure state forming a vortex structure (REVERSAL B, FIG. 3) may occur. As noted above, the magnetic direction of disturbed cells may be unintentionally switched through vortex formation and annihilation (i.e., REVERSAL B), which is a switching mechanism that requires a substantially large switching field. On the other hand, coherent rotation of magnetization (REVERSAL A) is a switching mechanism that generally requires a relatively small switching field. Because the switching field is larger in REVERSAL B than in REVERSAL A, the magnetic direction of selected cells is typically switched through coherent rotation of magnetization. In such a switching mechanism, the selected cell should be temporarily set in the S-state while all unselected cells should remain in the C-state to allow variation in the switching characteristics between unselected cells within the memory array. In other words, to prevent unintentional switching, the unselected cells should remain in the C-state due to the higher stability of the C-state relative to the S-state.

FIG. 3 is a transitional magnetic vector diagram illustrating exemplary switching mechanisms for disturbed cells. As such, FIG. 3 illustrates a switching mechanism in which reversal can occur when current is applied to only one conductive path. In one embodiment, current is applied along the bit line, such that a longitudinal magnetic field is induced solely along the easy axis (i.e. bit line, or long axis of the dot) of magnetization. In such an embodiment, the reversal of magnetization will typically occur through vortex formation and annihilation. In other words, the reversal of magnetization may occur for the disturbed cells, which correspond to substantially all dots (i.e., memory cells) located along the selected bit line. In the case that current is applied only along the digit line, a transverse magnetic field will be induced along the hard axis of magnetization. Such a transverse magnetic field, however, may not cause reversal of magnetization through vortex formation and annihilation.

FIG. 3 includes a first row of boxes (30a–36a) illustrating the applied magnetic field during steps before and after the reversal of magnetization. In addition, FIG. 3 includes a second row of boxes (30b–36b) illustrating the internal magnetic field vector pattern produced by the applied magnetic field in each step of the reversal process. Although the memory cell of FIG. 3 is shown having the shape of FIG. 2A, any asymmetrical shape as described herein, including but not limited to the embodiments shown in FIGS. 2A–F, may be alternatively depicted in FIG. 3.

In the equilibrium state, substantially no external magnetic field is applied (box 30a) to the memory cell. In this state, the magnetization naturally tends to set in the so-called C-state (box 30b) due to the asymmetrical shape of the memory cell. To begin the reversal process, however, a current is applied to the bit line to produce a magnetic field along the easy axis of the memory cell (box 32a). In the case that the magnetic direction of the memory cell is to be reversed, the bit line current is usually applied to produce a magnetic field in a direction opposite to the magnetization of the memory cell in the equilibrium state. In this manner, the magnetic field vectors within the memory cell begin to bend around a central portion to form a vortex region (box 32b). As noted above, the C-state is a relatively stable state. As such, the C-state typically requires a substantially high switching field, thereby requiring a substantially high level of current to switch the internal magnetization of the cell. In one example, the current applied to the bit line to induce vortex formation (box 32a) is about 7.5 mA, whereas substantially no current is applied to the digit line of the disturbed cell.

To reverse the magnetic direction of the memory cell, the current applied to the bit line is increased (box 34a). For example, the current applied to the bit line may be increased from 7.5 mA to 8.2 mA, as shown in FIG. 3. Such an increase results in a further increase in the curvature of the magnetic field vectors within the cell until annihilation occurs (box 34b). Annihilation occurs when the applied current increases enough to reverse the direction of the magnetic field vectors in the memory, cell to a substantially opposite direction. After reversal, the magnetization returns to the equilibrium C-state (box 36b) when the current in the bit line is turned off, and therefore no magnetic field is applied (box 36a).

It is noted that the applied bit line current (box 32a) and the subsequent increase in bit line current (box 34a) are not restricted to the exemplary values provided herein. Instead, the switching mechanism only requires that the applied current and the increase in current result in reversing the magnetic direction of the disturbed cell. However, as described above, reversal through vortex formation and annihilation corresponds to a relatively high field switching case. As such, the applied current and increased current may range between about 6 mA and about 10 mA. In general, the amount of current needed to reverse the magnetic direction of an asymmetrical memory cell is substantially higher than the amount of current needed to reverse the magnetic direction of a symmetrical memory cell. In this manner, though reversal of magnetization through vortex formation and annihilation may produce a write operation in disturbed cells having conventional configurations, it is unlikely to produce a write operation in disturbed cells having an asymmetrical configuration.

As such, the switching mechanism described above may produce reversal of magnetization within a disturbed memory cell when current is applied to only one conductive line (e.g., the bit line). However, vortex formation and annihilation does not usually apply for write operations in selected memory cells, which experience the effects of current applied along at least two conductive lines (e.g., a bit line and digit line). Therefore, a writing procedure for selected memory cells is also provided herein. Such a writing procedure may be substantially insensitive to the effects of fabrication process variations, such as cell shape, size, and the presence of defects. As such, the proposed writing procedure may allow inherently "harder" selected cells to be switched at relatively lower magnitudes of current. Such a writing procedure will herein be discussed in reference to FIGS. 4–11.

FIG. 4 is a transitional magnetic vector diagram illustrating an exemplary switching mechanism for selected memory cells. As such, FIG. 4 illustrates a writing procedure, in which current is applied along at least two orthogonal conductive lines to switch the magnetic direction of a particular memory cell. In one embodiment, current is applied along the digit line to induce a transverse, external magnetic field along the hard axis (i.e. short axis of the dot) of magnetization, prior to applying current along the bit line. The transverse magnetic field advantageously alters the internal magnetic field vector pattern to reduce the stability of the cell before switching the magnetic direction. In such an embodiment, the reversal of magnetization will typically occur through coherent rotation of magnetization.

Similar to FIG. 3, FIG. 4 includes a first row of boxes (40a–48a) illustrating the applied magnetic field during steps before and after the reversal of magnetization. In addition, FIG. 4 includes a second row of boxes (40b–18b) illustrating the internal magnetic field vector pattern produced by the applied magnetic field in each step of the reversal process. Although the memory cell of FIG. 4 is shown having the shape of FIG. 2A, any asymmetrical shape as described herein, including but not limited to the embodiments shown in FIGS. 2A–F, may be alternatively depicted in FIG. 4.

In FIG. 4, box 40b shows that the asymmetrical shape of the memory cell is responsible for inducing a magnetization in the C-state when no external magnetic fields are applied (box 40*a*). To begin the reversal process of a selected memory cell, current is applied to the selected digit line (DL) to induce a transverse magnetic field (box 42*a*), which sets and stabilizes the magnetization of the cell in the "S" state. In this manner, all cells located along the selected DL are initially stabilized in the S-state, making them easier to switch. For example, a DL current of 3 mA may be applied to induce a magnetic field vector pattern in the S-state (box 42*b*). Such a DL current is typically applied in the approximate direction of the longitudinal end vectors in the S-state (i.e. along the direction shown in FIG. 4, or to the right). However, if the transverse magnetic field is applied at 180 degrees (i.e. to the left), stabilizing the S-state will be substantially more difficult, and as a consequence, the switching field will become larger. Therefore, the current applied along the DL is preferably uni-polar (i.e., along one direction).

To reverse the magnetic direction of the memory cell, current may also be applied to the bit line (BL), such that the vector sum of the BL and DL currents induces an external magnetic field in a direction approximately opposite to the direction of the longitudinal end vectors in the initial S-state. For example, a current of −2.2 mA (the minus sign is a directional indicator) may be applied to the selected BL, such that the induced magnetic field (box 44*a*) causes the direction of magnetization within the selected cell (box 44*b*) to switch. Note that the reversal process is performed while the internal magnetization of the cell is in the S-state, or low switching field state. Such a state advantageously allows the selected cell to be switched with relatively small amounts of current. However, since the S-state is a relatively low stability state, the selected cell may be re-stabilized in the C-state by discontinuing the current applied to the DL prior to discontinuing the current applied to the BL. In this manner, removing current from the DL (while maintaining at least some current along the BL) may induce a longitudinal, external magnetic field (box 46*a*), which changes the internal magnetization from the S-state to a C-state (box 46*b*). For example, the current along the BL may remain at −2.2 mA, whereas substantially no current is applied along the DL. Subsequently, the current along the BL may be discontinued (box 48*a*) to stabilize the selected cell in the C-state at rest (box 48*b*).

Note, however, that the amounts of current applied to the bit line and digit line are not restricted to the values provided in FIG. 4. In particular, current magnitudes applied to the bit line and digit line may fall within a range of about 0 mA to about 5 mA, for example. In any embodiment, the amounts of current applied to the bit line and digit line during coherent rotation of magnetization will be significantly less than the amounts of current usually required in other switching mechanisms (e.g., vortex formation and annihilation).

In addition, the write operation described above (i.e., reversal through coherent rotation of magnetization) is not limited to the exact method presented above. For example, the step of stabilizing the cell prior to reversal (step 42*a*) may include applying current along the bit line instead of applying current along the digit line. Such a step, however, would induce a longitudinal magnetic field (step 42*b*), which may strengthen the cell magnetization in the C-state, thereby making the cell harder to switch. Thus, a higher current may be needed along the digit line during the step of reversing the magnetization (step 44*a*). In addition, the step of re-stabilization (box 46*a*) may alternatively include discontinuing the current applied to the digit line at approximately the same time as discontinuing the current applied to the bit line. Alternatively, the step may not discontinue the current along the digit line completely, but instead, may reduce the amount of current applied to the digit line until the induced magnetic field decreases to a point in which the magnetic vector state of the selected cell is re-stabilized.

Figure 5A:
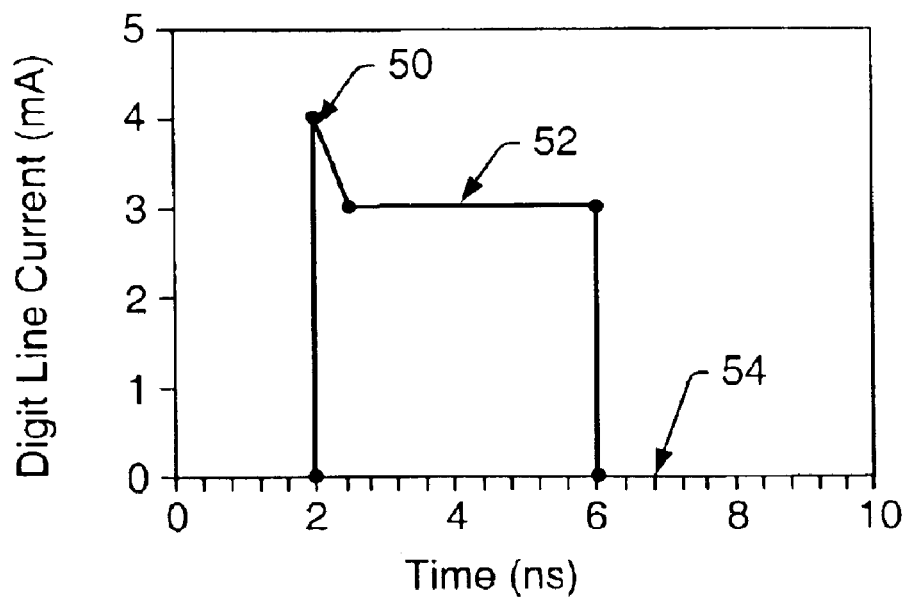
FIG. 5A is a graph illustrating a change in longitudinal current over time for a conductive line.

FIG. 5A illustrates a temporal embodiment of the amount of DL current (i.e., longitudinal current) needed to begin reversal of magnetization for a selected, asymmetrical MRAM cell using a switching mechanism, such as coherent rotation of magnetization. As such, FIG. 5A is a temporal embodiment of the DL current applied in the transitional switching mechanism illustrated in FIG. 4. Since the external magnetic field established by the DL current is in the transverse direction (i.e., about the hard axis), the memory cells arranged along the selected DL are typically harder to switch, especially if they do not sense a magnetic field induced by a bit line (BL) current about the easy axis. Therefore, an overshoot of current (reference numeral 50) along the DL may be needed for the first 0.5 ns, in some embodiments, if a higher field is needed to ensure the S-state is set for cells arranged along the DL pertaining to the selected cell. In other embodiments, however, an overshoot of digit line current (reference numeral 50) may be needed for an amount of time substantially less than 0.5 ns, or alternatively, substantially greater than 0.5 ns. For example, the amount of time needed for the overshoot current may lie between about 0.25 ns and about 1.0 ns. In addition, the amount of overshoot current in the digit line is not restricted to the amount depicted in FIG. 5A (i.e., approximately 4 mA). Instead, the amount of overshoot current could be an alternative amount of current, which results in stabilization of the S-state after application of the current for a particular amount of time. For example, the amount of current needed for the overshoot may lie between about 1 mA and about 6 mA. In an alternative embodiment, an overshoot of digit line current may not be needed to initially stabilize the magnetic vector state in the S-state.

As soon as the S-state is stabilized, however, only a small transverse field may be needed to maintain stabilization during the reversal process. Such a small transverse field may be generated by applying a lower current level to the DL (reference numeral 52). Alternatively, the S-state may be maintained by the initial level of current applied to the DL. It is noted, however, that the amount of digit line current needed to maintain the S-state during the reversal process, as well as the length of time the current is applied, is not restricted to the values presented in FIG. 5A (e.g., 3 mA and 3.5 ns, respectively). As such, the digit line current and application time may be substantially less than or greater than the values shown in FIG. 5A. In particular, the amount of digit line current needed to maintain the S-state during the reversal process may be between about 1 mA and about 4 mA. Likewise, the application time needed to maintain the S-state during the reversal process may be between about 2.5 ns and about 4.5 ns.

Figure 5B:
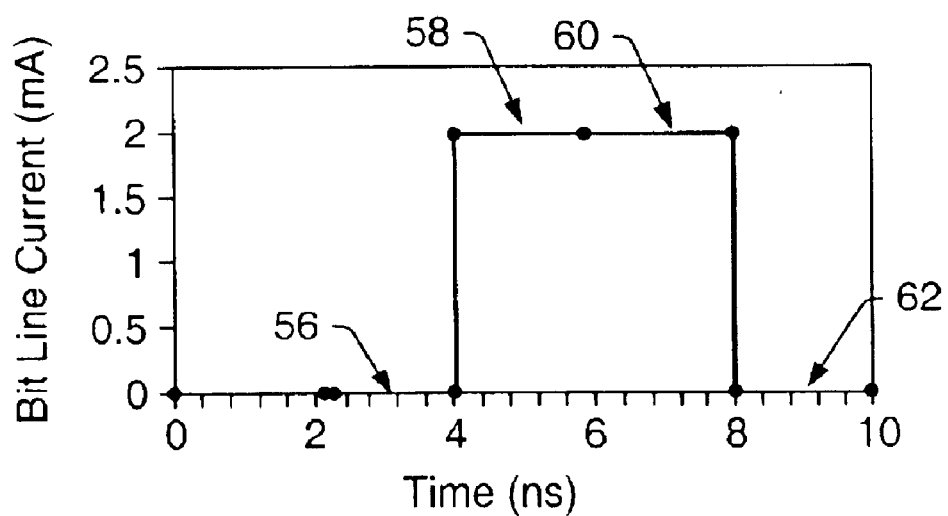
FIG. 5B is a graph illustrating a change in transverse current over time for a different conductive line.

FIG. 5B illustrates a temporal embodiment of the amount of BL current (i.e., transverse current) needed to induce reversal of magnetization in a selected, asymmetrical MRAM cell. As such, FIG. 5B is a temporal embodiment of the BL current applied in the transitional switching mechanism illustrated in FIG. 4. In one embodiment, after approximately 1–2 ns of DL current (reference numeral 50 in FIG. 5A), current is also applied along the BL to start the magnetization reversal process of the selected cell (as shown in boxes 44*a*–*b* of FIG. 4). For example, a current of −2.2 mA may be applied to the selected BL for approximately 1–2 ns (reference numeral 58 in FIG. 5B), such that the selected cell is now affected by an external magnetic field induced by the vector sum of the BL and DL currents. During this time, all bits along the selected BL will preferably remain in the C-state except for the selected bit, which now senses both BL and DL currents. After the writing sequence, the DL current may be terminated before termination of the BL current to ensure that substantially all bits (including the selected bit) return to a "C" equilibrium state. Such a case is illustrated in FIGS. 5A and 5B as reference numerals 54 and 60, respectively, indicating that the BL current is maintained for approximately 1–2 ns after the DL current is discontinued. Subsequently, current is substantially removed from the BL (reference numeral 62 in FIG. 5B) to re-stabilize the magnetic vector state of the selected cell in the C-state at rest.

In an alternative embodiment, the digit line and bit line currents may be switched off at approximately the same time to return the selected bit to the equilibrium state. In any embodiment, the bit line current values and application times are not restricted to those depicted in FIG. 5B. For example, the bit line current may vary between about 1 mA to about 4 mA, whereas the current application times may vary between about 1 ns and about 2 ns for each step. In addition, reference numeral 54 of FIG. 5A illustrates the case in which current is removed completely from the digit line to re-stabilize the selected cell in the C-state. In other embodiments, however, the current along to the digit line may not be completely removed in step 54, but instead, may be reduced until the magnetic vector state of the selected cell is sufficiently re-stabilized. For example, the current along the digit line may be reduced by an amount between about 1 mA to about 3 mA. In any case, such a reduction in current may be a stepped or gradual reduction.

The switching mechanism for a selected, asymmetrical memory cell, as described above in reference to FIG. 4, may also be described in reference to FIGS. 7–11. In particular, FIGS. 7–11 illustrate the manner in which magnetic vector states are modified within individual memory cells of magnetic memory cell array 70 during a write operation, such as the write operation described in FIG. 4. In one embodiment, magnetic memory array 70 includes a first set of a plurality of conductive lines (e.g., bit lines 72, 74, 76, etc.) and a second set of a plurality of conductive lines (e.g., digit lines 73, 75, 77, etc.).

Note, however, that the memory cells in FIGS. 7–11 are arranged above tie first and second sets of conductive lines for the sake of drawing clarity. In reality, the memory cells within an MRAM array are typically arranged between the first and second sets of conductive lines, and approximately at the intersecting regions between the first and second sets of the conductive lines. In addition, the memory cells in FIGS. 7–11 are illustrated as having substantially rectangular configurations for the sake of drawing clarity. Instead, the memory cells within the MRAM array preferably have asymmetrical configurations, such as but not limited to those depicted in FIGS. 2A–F. In some cases, one or more of the memory cells may have different asymmetrical shapes than other memory cells within the memory array. Alternatively, all of the memory cells may include substantially similar asymmetrical shapes. In yet other embodiments, only a number of the memory cell layers may include asymmetrical configurations. Such embodiments may be similar to the one or more layer configurations described for the structures shown in FIGS. 2A–F.

Figure 7:
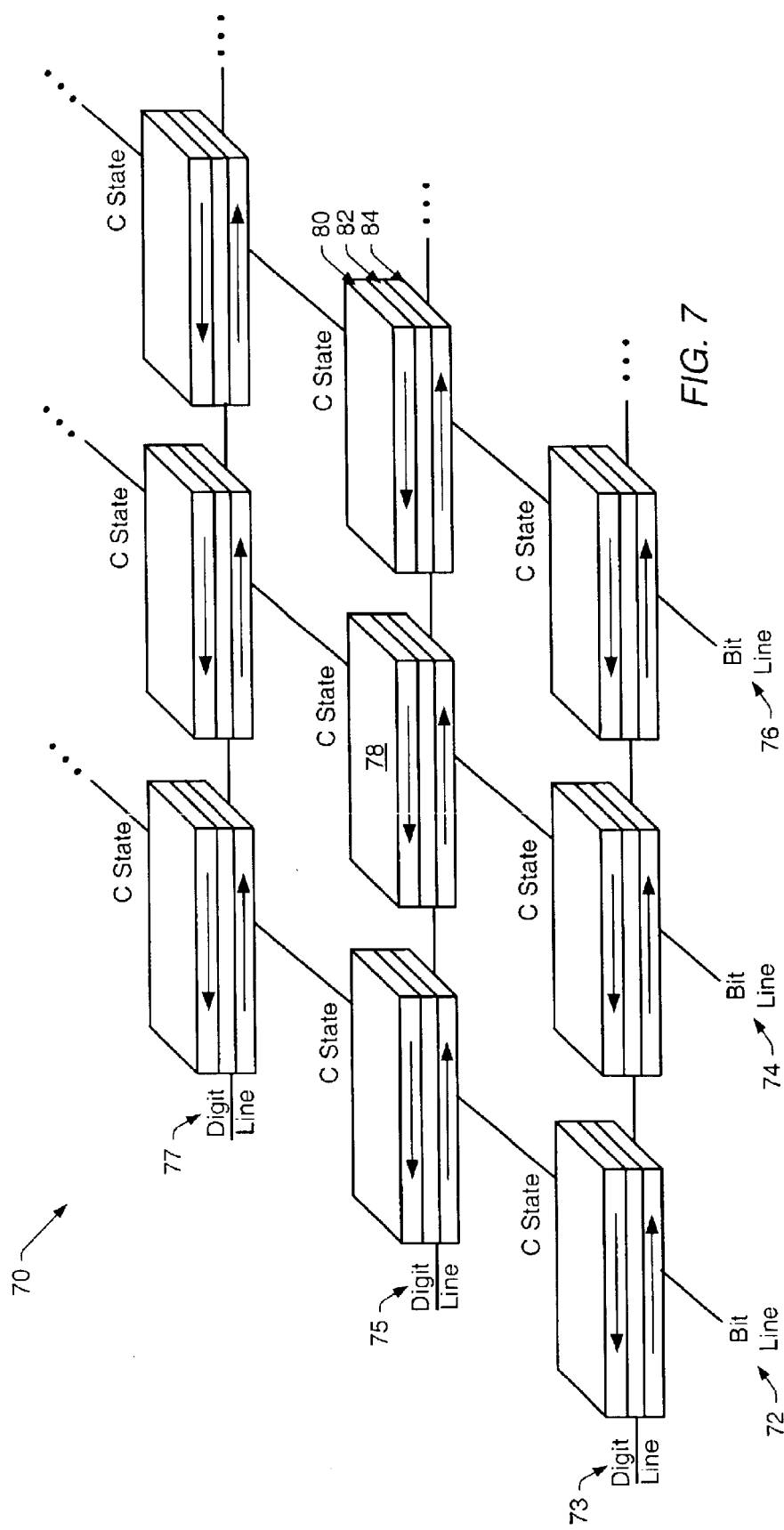
FIG. 7 is a block diagram illustrating a magnetic memory cell array in an equilibrium vector state, as shown in boxes 40a–b of FIG. 4.
Figure 8:
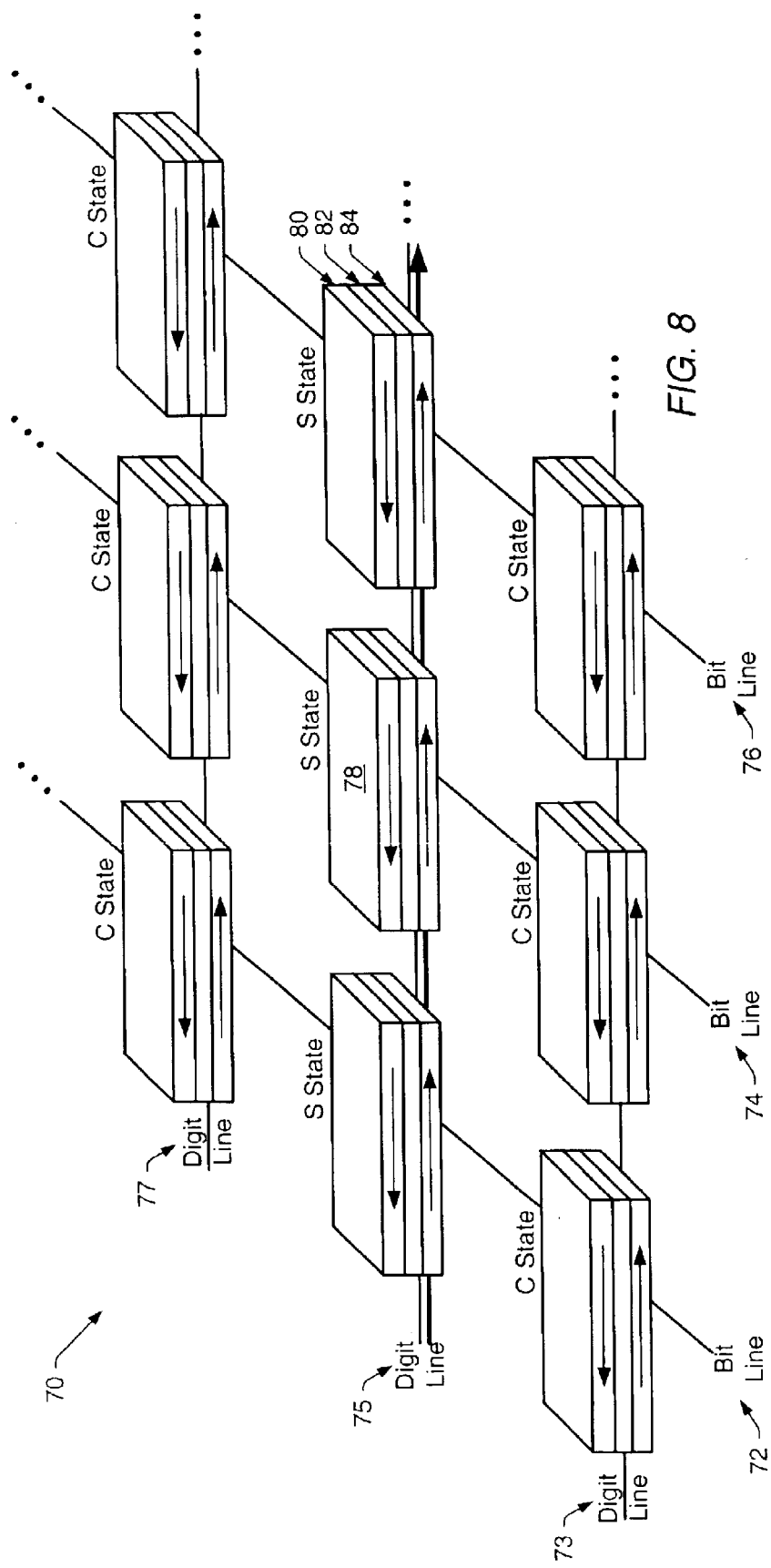
FIG. 8 is a block diagram illustrating exemplary vector states that result from the application of current along one conductive line within the magnetic memory cell array, as shown in boxes 42a–b of FIG. 4.

FIGS. 7–11 further illustrate the magnetic memory cells within array 70 as including a plurality of layers. In one embodiment, the magnetic memory cells within array 70 include at least two magnetic cell layers, such as storage layer 80 and pinned magnetic layer 84, which are separated by a nonmagnetic layer (i.e., tunneling layer 82). FIGS. 7–11 illustrate pinned magnetic layers 84 having magnetic directions fixed, or pinned in a particular direction (e.g., to the left). In addition, the initial magnetic direction of storage layers 80 are shown in opposite, or anti-parallel directions relative to the magnetic direction of pinned magnetic layers 84 (e.g., as shown in FIG. 7 to the right). However, the initial magnetic direction of storage layers 80 may not be the same for all memory cells within array 70. Such a case is merely illustrated in FIG. 7 for the sake of simplicity.

FIG. 7 shows that the shape of the asymmetrical memory cell typically induces a C-state when no external magnetic field is applied (see boxes 40a–b of FIG. 4). To begin the reversal process of selected memory cell 78, current is applied to digit line 75 in FIG. 8. As stated above, the current applied to digit line 75 may be an amount sufficient to induce a transverse magnetic field, which sets and stabilizes the magnetization of the disturbed cells arranged along digit line 75 in an alternative vector state. In this manner, all disturbed cells located along the selected digit line are initially stabilized in the S-state, or low switching state (see boxes 42a–b of FIG. 4). Note, however, that the memory cells not arranged along digit line 75 are maintained in the equilibrium C-state.

Figure 9:
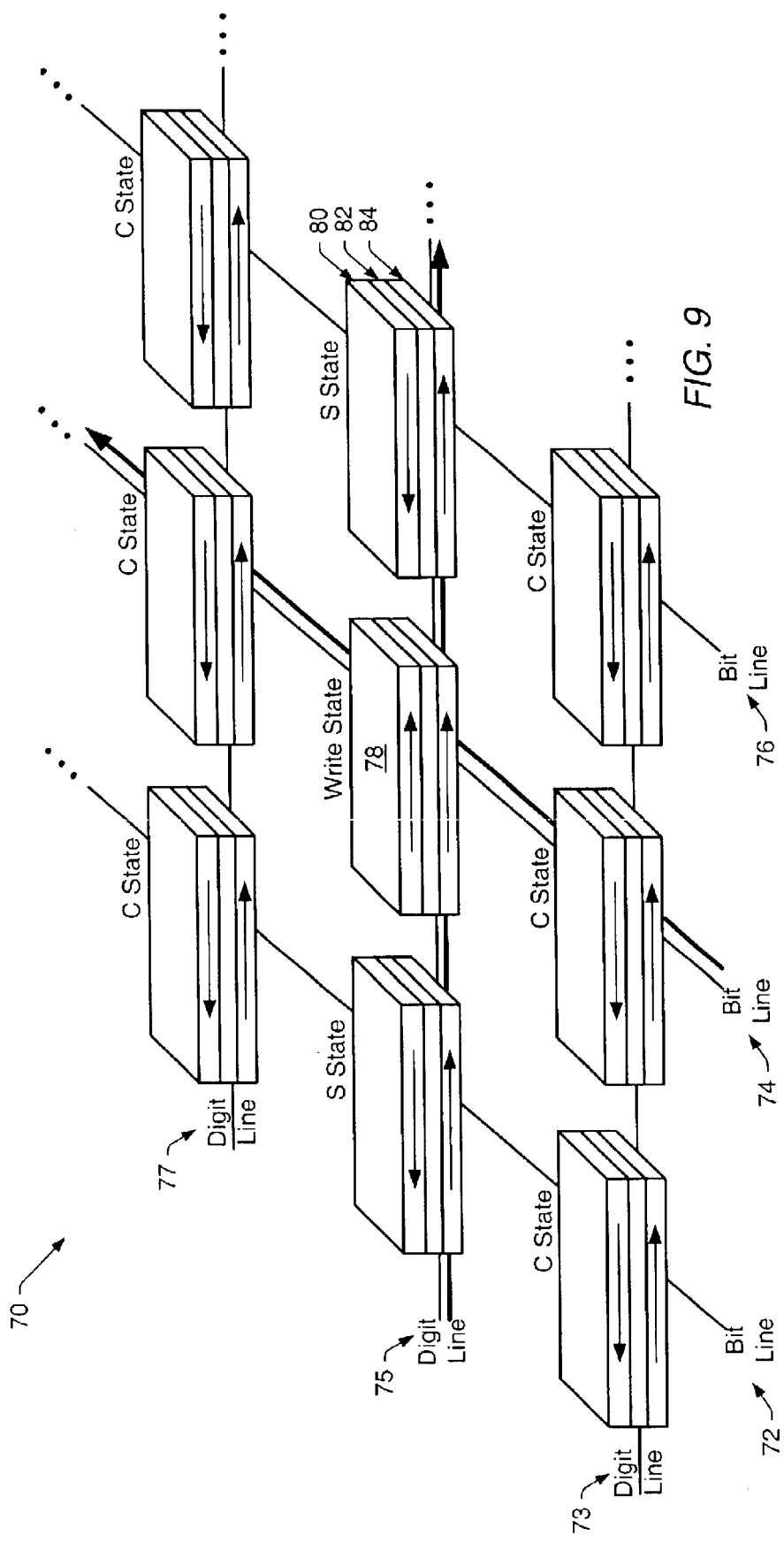
FIG. 9 is a block diagram illustrating exemplary vector states that result from the application of current along two conductive lines within the magnetic memory cell array, as shown in boxes 44a–b of FIG. 4.

To reverse the magnetic direction of selected cell 78, current may be applied to bit line 74 in FIG. 9. In this manner, the vector sum of the currents along bit line 74 and digit line 75 may induce an external magnetic field, which causes the direction of magnetization within selected cell 78 to switch (see boxes 44a–b of FIG. 4). In other words, a write operation (or write state) may be performed in selected cell 78, such that the direction of magnetization in storage layer 80 is switched from the anti-parallel direction to a parallel direction (relative to pinned magnetic layer 84). In another embodiment, however, the write operation may be performed in selected cell 78 by altering the direction of magnetization in the storage layer from a parallel direction to an anti-parallel direction. Note, however, that substantially all disturbed cells arranged along bit line 74 are maintained in an equilibrium C-state along their original direction of magnetization (i.e., the magnetic state of the cells are unchanged). Such maintenance is a typical result of the significantly high switching field of the switching mechanism used to switch disturbed cells along the selected bit line (e.g., vortex formation and annihilation).

Figure 10:
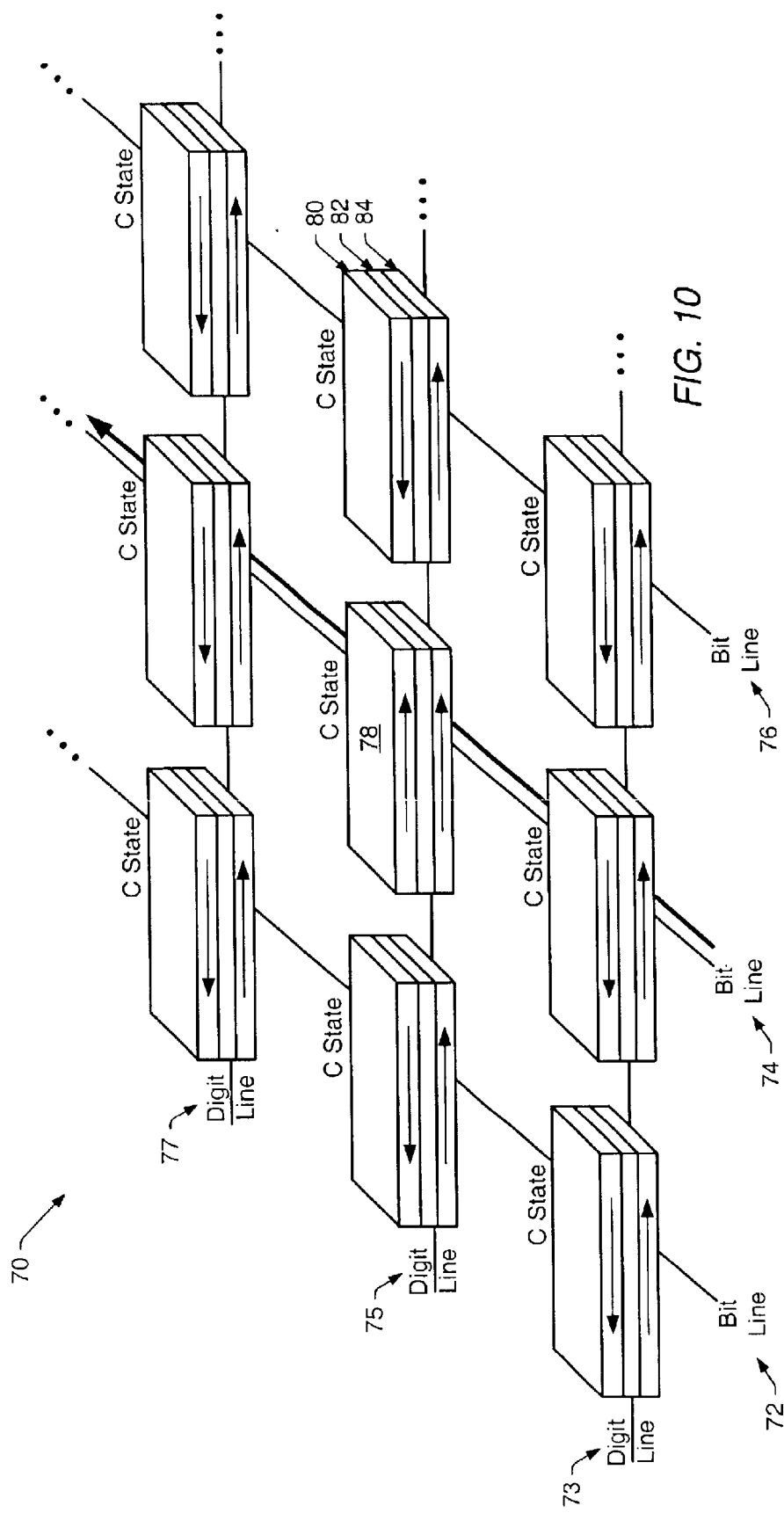
FIG. 10 is a block diagram illustrating exemplary vector states that result from the removal of the current applied to one of the conductive lines within the magnetic memory cell array, as shown in boxes 46a–b of FIG. 4.
Figure 11:
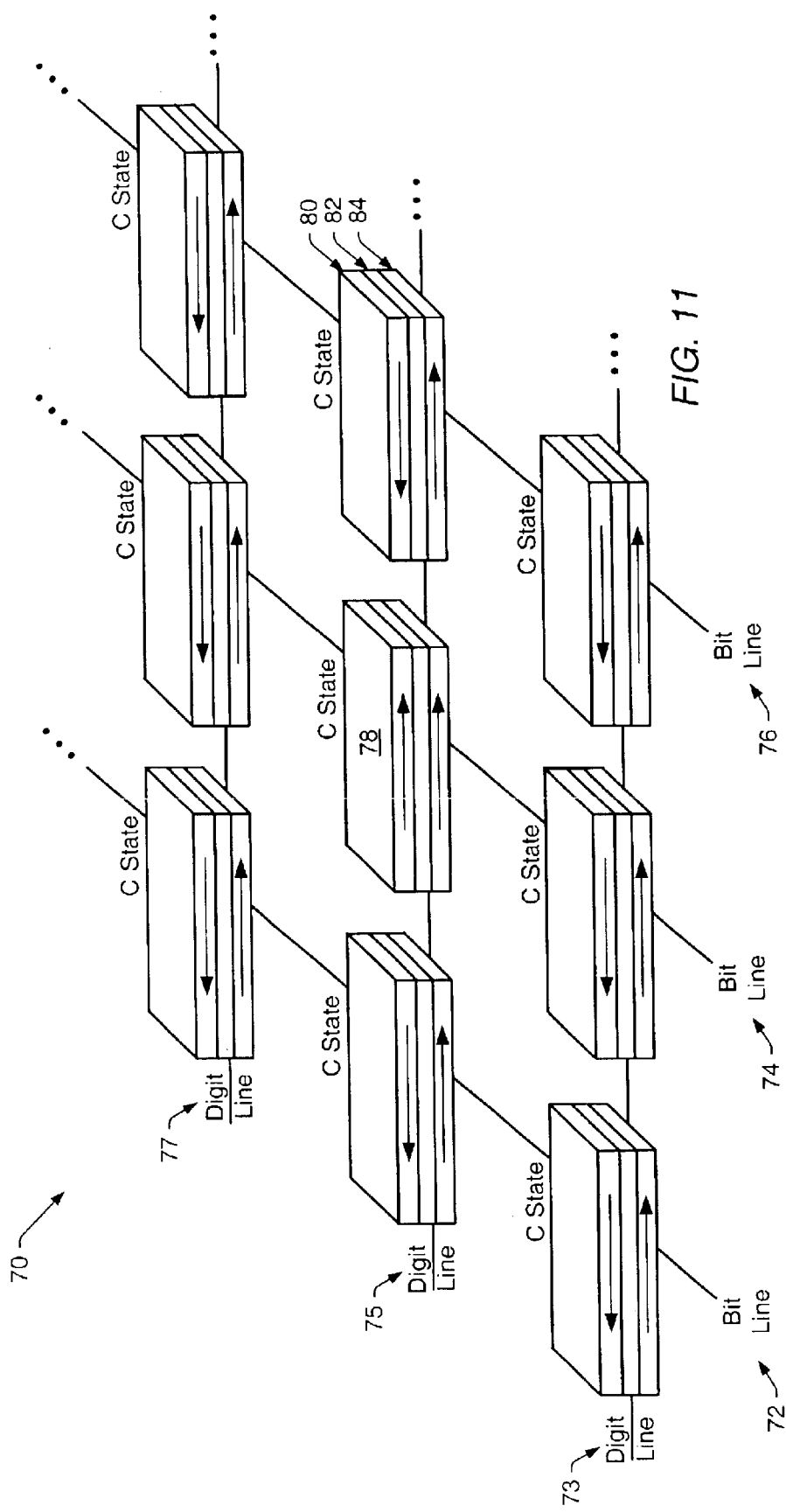
FIG. 11 is a block diagram illustrating exemplary vector states that result from the removal of the current applied to both conductive lines within the magnetic memory cell array, as shown in boxes 48a–b of FIG. 4.

As stated above, the write operation is performed while the internal magnetization of selected cell 78 is preferably in the S-state, so that the selected cell may be switched with relatively small amounts of current. However, since the S-state is a relatively low stability state, selected cell 78 may be re-stabilized in the C-state by discontinuing the current applied to digit line 75 prior to discontinuing the current applied to bit line 74 (as shown in FIG. 10). By removing current from digit line 75 prior to removing current from bit line 74, a longitudinal, external magnetic field may be induced, which changes the set magnetic direction of storage layer 80 from an S-state to a C-state (see boxes 46a–b of FIG. 4). In addition, by removing current from digit line 75, the magnetization of the disturbed memory cells arranged along digit line 75 may also be re-stabilized to a C-state. Subsequently, the current along bit line 74 may be discontinued to stabilize selected cell 78 in an equilibrium C-state, as shown in FIG. 11. As stated above, selected cell 78 may be alternatively re-stabilized by discontinuing the current applied to digit line 75 at substantially the same time as discontinuing the current applied to bit line 74. In another embodiment, the current along digit line 75 may stepped down, or gradually reduced until selected cell 78 is re-stabilized.

FIGS. 12A–D illustrate exemplary embodiments of an asymmetrically shaped memory cell, such as the memory cell depicted in FIG. 2A. In addition, FIGS. 12A–D include outlines of the one or more photolithography masks used to create the individual cell shapes. Note that the memory cell shapes in FIGS. 12A–D are shown as asymmetrically circular structures having smooth edges. As stated above, such smooth edges are desirable in a magnetic memory cell, and may be a result from the one or more photolithography masks. As such, the one or more photolithography masks form patterns 120, 122, 124, and 126, where each pattern includes a contour having a plurality of steps. Depending on the intricacy of the pattern (i.e., the number of steps), the asymmetry of the cell and the rounding of the cell can be tuned accordingly. For example, the photolithography pattern shown in FIG. 12B may include at least two additional steps as compared to the photolithography pattern shown in FIG. 12A. Such additional steps may result in the cell depicted in FIG. 12B to be slightly less asymmetrical than the cell depicted in FIG. 12A. As another example, changing the number of steps and/or changing the layout of the steps in a photolithography pattern can further alter the rounding of the cell shape, as shown in the comparison of FIGS. 12C–D. For example, FIG. 12C illustrates photolithography pattern 124 as having a contour with a greater width than photolithography pattern 126 shown in FIG. 12D. As such, the cell shape depicted in FIG. 12C may be slightly less rounded than the cell shape depicted in FIG. 12D.

In any case, photolithography patterns 120, 122, 124, and 126 are provided as exemplary embodiments, such that an asymmetrical cell shape is not restricted to the examples provided. In addition, the cell shapes depicted in FIGS. 12A–D are not restricted to the cell shape described in FIG. 2A. Instead, any asymmetrical cell shape, such as those provided in FIGS. 2B–F, may be fabricated in substantially the same manner as that described in reference to FIGS. 12A–D.

It will be appreciated to those skilled in the art having the benefit of this disclosure that this invention is believed to provide an improved magnetic memory cell (e.g., an MRAM cell) that is less sensitive to variations in shape, size, and the inclusion of defects. Such a memory cell will have an asymmetric configuration including smooth edges. The advantage of such a configuration will provide relatively uniform switching characteristics within all memory cells of a memory array. Further modifications and alternative embodiments of various aspects of the invention will be apparent to those skilled in the art in view of this description. For example, a write operation may be performed by altering the direction of magnetization in the storage layer from an anti-parallel to a parallel direction. Alternatively, a write operation may be performed by substantially maintaining the direction of magnetization in the storage layer of a memory cell. Therefore, it is intended that the following claims be interpreted to embrace all such modifications and changes and, accordingly, the specification and drawings are to be regarded in an illustrative rather than a restrictive sense.

What is claimed is:

1. A magnetic random access memory device configured to store a logic state of a bit with respect to magnetic directions of magnetic layers within a memory cell of the device, wherein the memory cell comprises a magnetic layer having a shape substantially asymmetrical along one dimension of the magnetic layer and substantially symmetrical along another dimension of the magnetic layer.

2. The magnetic random access memory device of claim 1, wherein the one dimension is an elongated dimension of the magnetic layer.

3. The magnetic random access memory device of claim 2, wherein the shape of the magnetic layer comprises a curved portion along at least one side of the magnetic layer aligned with the elongated dimension.

4. The magnetic random access memory device of claim 1, wherein the one dimension is a shortened dimension of the magnetic layer.

5. The magnetic random access memory device of claim 1, wherein at least one of the memory cells comprises a plurality of layers having shapes substantially similar to the shape of the magnetic layer.

6. A magnetic random access memory device configured to store a logic state of a bit with respect to magnetic directions of magnetic layers within a memory cell of the device, wherein the memory cell comprises a magnetic layer with a perimeter having a larger curvature along one side of the perimeter than an opposing side of the perimeter.

7. The magnetic random access memory device of claim 6, wherein the one side of the perimeter comprises a curved portion having a different radial length than other curved portions arranged along the one side of the perimeter.

8. The magnetic random access memory device of claim 6, wherein the opposing side is substantially straight.

9. The magnetic random access memory device of claim 6, wherein the opposing side is concave.

10. The magnetic random access memory device of claim 6, wherein the opposing side is convex.

11. The magnetic random access memory device of claim 6, wherein the one side of the perimeter and the opposing side of the perimeter are arranged along an elongated dimension of the magnetic layer.

12. The magnetic random access memory device of claim 6, wherein the magnetic layer comprises a shape that is substantially asymmetrical about an axis of the magnetic layer aligned with the one side of the perimeter and the opposing side of the perimeter.

13. A magnetic random access memory device configured to store a logic state of a bit with respect to magnetic directions of magnetic layers within a memory cell of the device, wherein the memory cell comprises a magnetic layer having a shape substantially asymmetrical about a reference axis aligned with a first dimension of the magnetic layer and positioned approximately midway along a second dimension of the magnetic layer perpendicular to the first dimension, and wherein a first area of the magnetic layer laterally bound by one side of the reference axis and the periphery of the magnetic layer is larger than a second area of the magnetic layer laterally bound by the opposing side of the reference axis and the periphery of the magnetic layer.

14. The magnetic random access memory device of claim 13, wherein the periphery of the magnetic layer has a larger curvature along one side of the periphery than an opposing side of the periphery.

15. The magnetic random access memory device of claim 14, wherein a portion of the opposing side is substantially straight.

16. The magnetic random access memory device of claim 14, wherein a portion of the opposing side is convex.

17. The magnetic random access memory device of claim 13, wherein the shape of the magnetic layer is additionally asymmetrical along the second dimension of the magnetic layer.

18. The magnetic random access memory device of claim 13, wherein the shape of the magnetic layer is asymmetrical along the second dimension of the magnetic layer.

19. The magnetic random access memory device of claim 13, wherein an aspect ratio of the first and second dimension is between approximately 1.0 and approximately 2.0.

20. The magnetic random access memory device of claim 13, wherein a memory cell comprising the magnetic layer comprises one or more layers having shapes substantially different than the shape of the magnetic layer.

* * * * *

UNITED STATES PATENT AND TRADEMARK OFFICE
CERTIFICATE OF CORRECTION

PATENT NO. : 6,798,691 B1
DATED : September 28, 2004
INVENTOR(S) : Ounadjela et al.

It is certified that error appears in the above-identified patent and that said Letters Patent is hereby corrected as shown below:

Column 25,
Line 2, please delete "asymmetrical" and substitute therefor -- symmetrical --.
Line 5, please delete "dimension" and substitute therefor -- dimensions --.

Signed and Sealed this

Eighth Day of February, 2005

JON W. DUDAS
*Director of the United States Patent and Trademark Office*